(12) United States Patent
Kim et al.

(10) Patent No.: US 8,259,249 B2
(45) Date of Patent: Sep. 4, 2012

(54) DISPLAY SUBSTRATE, METHOD OF MANUFACTURING THE DISPLAY SUBSTRATE AND DISPLAY DEVICE HAVING THE DISPLAY SUBSTRATE

(75) Inventors: Dong-Gyu Kim, Yongin-Si (KR); Seung-Soo Baek, Seoul (KR); Mee-Hye Jung, Suwon-si (KR); Dong-Hyeon Ki, Seoul (KR); Sei-Hyoung Jo, Seoul (KR); Hye-Seok Na, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 50 days.

(21) Appl. No.: 12/898,586

(22) Filed: Oct. 5, 2010

(65) Prior Publication Data
US 2011/0085100 A1    Apr. 14, 2011

(30) Foreign Application Priority Data

Oct. 12, 2009 (KR) .................. 10-2009-0096565
Oct. 27, 2009 (KR) .................. 10-2009-0102072

(51) Int. Cl.
  *G02F 1/136* (2006.01)
(52) U.S. Cl. .................................. 349/48
(58) Field of Classification Search .............. 349/48
  See application file for complete search history.

(56) References Cited

U.S. PATENT DOCUMENTS

| 2007/0236638 A1 | 10/2007 | Wu |
| 2007/0268423 A1 | 11/2007 | Yi et al. |
| 2008/0180624 A1 | 7/2008 | Choi et al. |

FOREIGN PATENT DOCUMENTS

| JP | 2001-075123 | 3/2001 |
| JP | 2002-090721 | 3/2002 |
| JP | 2003-149670 | 5/2003 |
| JP | 2003-161954 | 6/2003 |
| KR | 1997-7007466 | 12/1997 |
| KR | 100219119 B1 | 6/1999 |
| KR | 10-2000-0060195 A | 10/2000 |
| KR | 10-2004-0095829 A | 11/2004 |
| KR | 10-2007-0000908 A | 1/2007 |
| KR | 10-2007-0001792 A | 1/2007 |
| KR | 10-2007-0025150 A | 3/2007 |
| KR | 10-2007-0070723 A | 7/2007 |
| KR | 10-2008-0001931 A | 1/2008 |
| KR | 10-2008-0044434 A | 5/2008 |
| KR | 10-2008-0047710 A | 5/2008 |
| KR | 10-2008-0050674 A | 6/2008 |
| KR | 10-2008-0054228 A | 6/2008 |
| KR | 10-2008-0060889 A | 7/2008 |
| KR | 10-2008-0073037 A | 8/2008 |
| KR | 10-2008-0112849 A | 12/2008 |
| KR | 10-2009-0012409 A | 2/2009 |
| KR | 10-2009-0022078 A | 3/2009 |
| KR | 10-2009-0036866 A | 4/2009 |
| KR | 10-2009-0047327 A | 5/2009 |

*Primary Examiner* — Phu Vu
(74) *Attorney, Agent, or Firm* — Innovation Counsel LLP

(57) ABSTRACT

A display substrate includes a first pixel electrode and a second pixel electrode. The first pixel electrode includes a plurality of first electrode bars. A data line provides a data voltage to the first pixel electrode. The second pixel electrode includes a plurality of second electrode bars alternately disposed with the first electrode bars. A first power line is formed adjacent to a gate line to provide a first voltage to the second pixel electrode. A second power line crosses the first power line and is electrically connected to the first power line. A first switching element is electrically connected to the data line, the gate line and the first pixel electrode. A second switching element is electrically connected to the first power line, the gate line and the second pixel electrode.

46 Claims, 22 Drawing Sheets

US 8,259,249 B2

DISPLAY SUBSTRATE, METHOD OF MANUFACTURING THE DISPLAY SUBSTRATE AND DISPLAY DEVICE HAVING THE DISPLAY SUBSTRATE

PRIORITY STATEMENT

This application claims priority, under 35 U.S.C. §119, to Korean Patent Application No. 2009-96565 filed on Oct. 12, 2009 and Korean Patent Application No. 2009-102072 filed on Oct. 27, 2009 in the Korean Intellectual Property Office (KIPO), the contents of which are herein incorporated by reference in their entireties.

BACKGROUND OF THE INVENTION

1. Field of the Invention

The present invention relates to a display substrate, a method of manufacturing the display substrate and a display device having the display substrate. More particularly, the present invention relates to a display substrate capable of improving a display quality, a method of manufacturing the display substrate and a display device having the display substrate.

2. Description of the Related Art

Flat panel display devices are widely used in various fields today. A display device, such as a liquid crystal display (LCD), typically includes a display substrate and an opposite substrate with a liquid crystal layer interposed between them. The display substrate may have electric field generating electrodes such as a first pixel electrode and a second pixel electrode formed on it.

When a voltage is applied to the first pixel electrode and the second pixel electrode, an electric field forms between the first pixel electrode and the second pixel electrode in the liquid crystal layer. The arrangement of the liquid crystal molecules in the liquid crystal layer is altered in response to the electric field, and thus light transmittance through the liquid crystal layer may be adjusted by controlling the polarization of an incident light. This way, desired images are displayed.

Liquid crystal molecules of the liquid crystal layer may be operated in a vertically aligned (VA) mode by an electric field formed between the first pixel electrode and the second pixel electrode. In the VA mode, in the absence of an electric field between the first pixel electrode and the second pixel electrode, a display panel may display a black image. When a horizontal electric field is formed between the first pixel electrode and the second pixel electrode, the display panel may display an image that falls in a range of gray-scale levels.

Often, a display panel includes a display area displaying the image and a peripheral area surrounding the display area.

When a first voltage and a second voltage are provided to the second pixel electrode, power lines transmitting the first and second voltages are disposed in one direction, for example a horizontal direction or a vertical direction (in plan view). Thus, delays in transmission of the first and second voltages through the power lines may occur. Due to this delay, the second pixel electrode may be charged at a slower rate at one side of the display area than at another side, undesirably lowering the overall display quality.

In addition, when different voltages are applied to the first and second pixel electrodes, a horizontal electric field forms between a data line and the first pixel electrode and between the data line and the second pixel electrode. These horizontal electric fields may cause undesirable light leakage.

SUMMARY OF THE INVENTION

The present invention provides a display substrate capable of improving a display quality thereof.

The present invention also provides a method of manufacturing the above-mentioned display substrate.

The present invention further provides a display device having the above-mentioned display substrate.

According to one aspect of the present invention, a display substrate includes a first pixel electrode, a data line, a second pixel electrode, a gate line, a first power line, a second power line, a first switching element and a second switching element. The first pixel electrode includes a plurality of first electrode bars. The data line provides a data voltage to the first pixel electrode. The second pixel electrode includes a plurality of second electrode bars alternately disposed with the first electrode bars. The gate line substantially crosses the data line. The first power line extending in a same direction as the gate line to provide a first voltage to the second pixel electrode. The second power line crosses the first power line and electrically connected to the first power line. The first switching element is electrically connected to the data line, the gate line and the first pixel electrode. The second switching element is electrically connected to the first power line, the gate line and the second pixel electrode.

The second power line may be disposed at multiple data lines.

The display substrate may further include a third pixel electrode, a fourth pixel electrode, a third power line and a fourth power line. The third pixel electrode may be disposed adjacent to the first pixel electrode. The third pixel electrode may include a plurality of third electrode bars. The fourth pixel electrode may include a plurality of fourth electrode bars alternately disposed with the third electrode bars. The third power line may be formed adjacent to the first power line to provide a second voltage to the fourth pixel electrode. The fourth power line may extend in a direction crossing the third power line and electrically connected to the third power line.

The fourth power line may be disposed at multiple data lines.

A plurality of data lines may be disposed between the second power line and the fourth power line.

The second power line may be alternately disposed with respect to the data line corresponding to pixels adjacent in an extension direction of the data line, and the fourth power line may be alternately disposed with respect to the data line corresponding to pixels adjacent in an extension direction of the data line.

The display substrate may further include a third switching element and a fourth switching element. The third switching element may be connected to the gate line and the third pixel electrode. The fourth switching element may be connected to the gate line and the fourth pixel electrode.

The second switching element may include a first gate electrode, a first source electrode and a first drain electrode. The first gate electrode may be electrically connected to the gate line. The first source electrode may be electrically connected to the first power line and connected to the second power line. The first drain electrode electrically connected to the second pixel electrode.

According to another aspect of the present invention, there is provided a method of manufacturing a display substrate as follows. In the method, a gate line extending in a first direction and a first power line adjacent to the gate line are formed on a base substrate. A data line and a second power line extend in a second direction crossing the first direction and are formed on the base substrate including the gate line and the first power line. A first pixel electrode including a plurality of first electrode bars and electrically connected to the data line through a first switching element, and a second electrode including a plurality of second electrode bars alternately disposed with the first electrode bars and electrically connected to the first power line through a second switching element are formed on the base substrate comprising the data line and the second power line. The first power line and the second power line are electrically connected to each other.

When the first power line is formed, a third power line parallel to the first power line may be further formed.

When the second power line is formed, a fourth power line may be further formed in the second direction.

A plurality of data lines may be disposed between the second power line and the fourth power line.

The first power line and the second power line may be electrically connected through a first transparent electrode.

The first power line and the second power line may be electrically connected through a source electrode of the first switching element.

According to still another aspect of the present invention, a display device includes a display substrate, an opposite substrate and a liquid crystal layer. The display substrate includes a first pixel electrode, a data line, a second pixel electrode, a gate line, a first power line, a second power line, a first switching element and a second switching element. The first pixel electrode includes a plurality of first electrode bars. The data line provides a data voltage to the first pixel electrode. The second pixel electrode includes a plurality of second electrode bars alternately disposed with the first electrode bars. The gate line substantially crosses the data line. The first power line is formed adjacent to the gate line to provide a first voltage to the second pixel electrode. The second power line crosses the first power line to be electrically connected to the first power line. The first switching element is electrically connected to the data line, the gate line and the first pixel electrode. The second switching element is electrically connected to the first power line, the gate line and the second pixel electrode. The opposite substrate faces the display substrate. The liquid crystal layer is disposed between the display substrate and the opposite substrate.

The display substrate may further include a third pixel electrode, a fourth pixel electrode, a third power line and a fourth power line. The third pixel electrode may be disposed adjacent to the first pixel electrode. The third pixel electrode may include a plurality of third electrode bars. The fourth pixel electrode may include a plurality of fourth electrode bars alternately disposed with the third electrode bars. The third power line may be formed adjacent to the first power line to provide a second voltage to the fourth pixel electrode. The fourth power line may extend in a direction crossing the third power line and may be electrically connected to the third power line.

The second power line may be alternately disposed with respect to the data line corresponding to pixels adjacent in an extension direction of the data line, and the fourth power line may be alternately disposed with respect to the data line corresponding to pixels adjacent in an extension direction of the data line.

The second power line and the fourth power line may be alternately disposed at multiple data lines.

The liquid crystal layer may be vertically aligned when a driving voltage is not applied thereto, and may be horizontally aligned by the first pixel electrode and the second pixel electrode when the driving voltage is applied thereto.

The display device may include a display area and a peripheral area surrounding the display area, and a power wire may be connected to the second power line and the fourth power line may be formed on the peripheral area which is disposed on an upper portion of the display substrate, a right portion of the display substrate and a left portion of the display substrate, when viewed on the display substrate.

According to still another aspect of the present invention, a display substrate includes a first pixel electrode, a second pixel electrode, a first shield pattern and a second shield pattern. The first pixel electrode is electrically connected to a gate line and a first data line. The second pixel electrode is alternately disposed with the first pixel electrode to be electrically connected to the gate line and a first power line. The first shield pattern is disposed closely to at least one of the first data line and a second data line facing the first data line. The first shield pattern overlaps with a first end portion of the first pixel electrode to be electrically connected to the first pixel electrode. The second shield pattern is disposed closely to at least one of the first data line and the second data line. The second shield pattern overlaps with a first end portion of the second pixel electrode to be electrically connected to the second pixel electrode.

The gate line, the first shield pattern and the second shield pattern may be formed from identical same conductive layer.

The display substrate may further include a first switching element electrically connected to the first data line and the gate line, and a second switching element electrically connected to the gate and the first power line.

The first switching element may include a first gate electrode connected to the gate line, a first source electrode connected to the first data line, and a first drain electrode connected to the first pixel electrode. The first drain electrode and the first shield pattern make contact with the first pixel electrode through a first contact hole.

The second switching element may include a second gate electrode connected to the gate line, a second source electrode connected to the first power line adjacent to the gate line, and a second drain electrode connected to the second pixel electrode. The second drain electrode and the second shield pattern make contact with the second pixel electrode through a second contact hole.

The display substrate may further include a third shield pattern and a fourth shield pattern. The third shield pattern is disposed closely to the second data line to cover a second end portion of the first pixel electrode. The fourth shield pattern is disposed closely to the first data line to cover a second end portion of the second pixel electrode.

The third shield pattern may be electrically connected to the first pixel electrode through a third contact hole formed through an end portion of the third shield pattern, and the fourth shield pattern may be electrically connected to the second pixel electrode through a fourth contact hole formed through an end portion of the fourth shield pattern.

The third shield pattern may be formed closely to the second data line to cover the second end portion of the first pixel electrode, and the fourth shield pattern may be formed closely to the first data line to cover the second end portion of the second pixel electrode.

The display substrate may further include a connection pattern connecting the first shield pattern and the third shield pattern.

The display substrate may further include a second power line adjacent to the first power line and receiving a voltage different from a voltage of the first power line.

The first data line and the second data line extend in varying diagonal directions, and a pixel area between the first data line and the second data line may include a vertical area formed at a center portion of the pixel area.

The first shield pattern may be formed on one side of the vertical area, and the second shield pattern may be formed on the other side of the vertical area.

An edge portion of the first shield pattern corresponding to a far area from the first data line may fully overlap an edge portion of the first pixel electrode corresponding to a far area from the first data line, and an edge portion of the second shield pattern corresponding to a far area from the second data line may fully overlap an edge portion of the second pixel electrode corresponding to a far area from the second data line.

The display substrate may further include a connection pattern connecting the first shield pattern and the third shield pattern. In this case, the connection pattern overlaps the first and second pixel electrodes.

According to still another aspect of the present invention, there is provided a method of manufacturing a display substrate as follows. In the method, a gate line extending in a first direction and a first shield pattern and a second shield pattern extending in a second direction are formed on a base substrate. A first data line extending to the second direction and disposed closely to at least one of the first shield pattern and the second shield pattern, and a second data line facing the first data line and disposed closely to at least one of the first shield pattern and the second shield pattern are formed. A first pixel electrode which has a first end portion that partially overlaps the first shield pattern and contacts the first shield pattern through a first contact hole, and a second pixel electrode which has a first end portion that partially overlaps the second shield pattern and contacts the second shield pattern through a second contact hole are formed.

A first power line adjacent to the gate line may be further formed when the gate line is formed.

A first switching element including a first source electrode connected to the first data line, a first gate electrode connected to the gate line, and a first drain electrode contacting the first shield pattern and the first pixel electrode through the first contact hole, may be further formed. Then, a second switching element including a second source electrode connected to the first power line, a second gate electrode connected to the gate line, and a second drain electrode contacting the second shield pattern and the second pixel electrode through the second contact hole, may be further formed.

A second power line adjacent to the first power line may be further formed when the gate line is formed.

A third shield pattern closely disposed to the second data line and covering a second end portion of the first pixel electrode may be further formed. Then, a fourth shield pattern disposed closely to the first data line and covering a second end portion of the second pixel electrode may be further formed.

The first pixel electrode may contact to the third shield pattern through a third contact hole, and the second pixel electrode may contact to the fourth shield pattern through a fourth contact hole.

A connection pattern connecting the first shield pattern and the third shield pattern may be further formed when the gate line is formed.

When the first data line and the second data line are formed, the first data line and the second data line may extend in varying diagonal directions in areas close to neighboring gate lines and may extend in a vertical direction at center portions between the areas close to the neighboring gate lines.

According to still another aspect of the present invention, a display device includes a display substrate, an opposite substrate and a liquid crystal layer. The display substrate includes a first pixel electrode, a second pixel electrode, a first shield pattern and a second shield pattern. The first pixel electrode is electrically connected to a gate line and a first data line. The second pixel electrode is alternately disposed with the first pixel electrode and electrically connected to the gate line and a first power line. The first shield pattern is disposed closely to at least one of the first data line and a second data line facing the first data line, overlaps a first end portion of the first pixel electrode, and is electrically connected to the first pixel electrode. The second shield pattern is disposed closely to at least one of the first data line and the second data line, overlaps a first end portion of the second pixel electrode, and is electrically connected to the second pixel electrode. The opposite substrate faces the display substrate. The liquid crystal layer is disposed between the display substrate and the opposite substrate.

The liquid crystal layer may be vertically aligned when a driving voltage is not applied thereto, and may be horizontally aligned by the first pixel electrode and the second pixel electrode when the driving voltage is applied thereto.

The display device may further include a third shield pattern and a fourth shield pattern. The third shield pattern is disposed closely to the second data line to cover a second end portion of the first pixel electrode. The fourth shield pattern is disposed closely to the first data line to cover a second end portion of the second pixel electrode.

The first data line and the second data line may extend in varying diagonal directions, and a pixel area between the first data line and the second data line may include a vertical area formed at a center portion of the pixel area when viewed from a plan view.

The second and fourth power lines respectively connected to first and third power lines disposed in an extension direction of a gate line may be alternately disposed at every data line, so that a first voltage and a second voltage are uniformly applied to a display area without a delay. Thus, a reduction of a charge rate generated at one side of the display area may be prevented.

In addition, shield patterns connected to a first pixel electrode and a second pixel electrode may be formed adjacent to a data line to overlap the first pixel electrode and the second pixel electrode. Therefore, a horizontal electric field generated between the first pixel electrode and the data line, and a horizontal electric field generated between the second pixel electrode and the data line may be prevented, so that leakage of light may be prevented. As a result, display quality may be improved.

BRIEF DESCRIPTION OF THE DRAWINGS

The above and other features and advantages of the present invention will become more apparent by describing in detailed example embodiments thereof with reference to the accompanying drawings, in which.

DETAILED DESCRIPTION OF THE INVENTION

Figure 1:
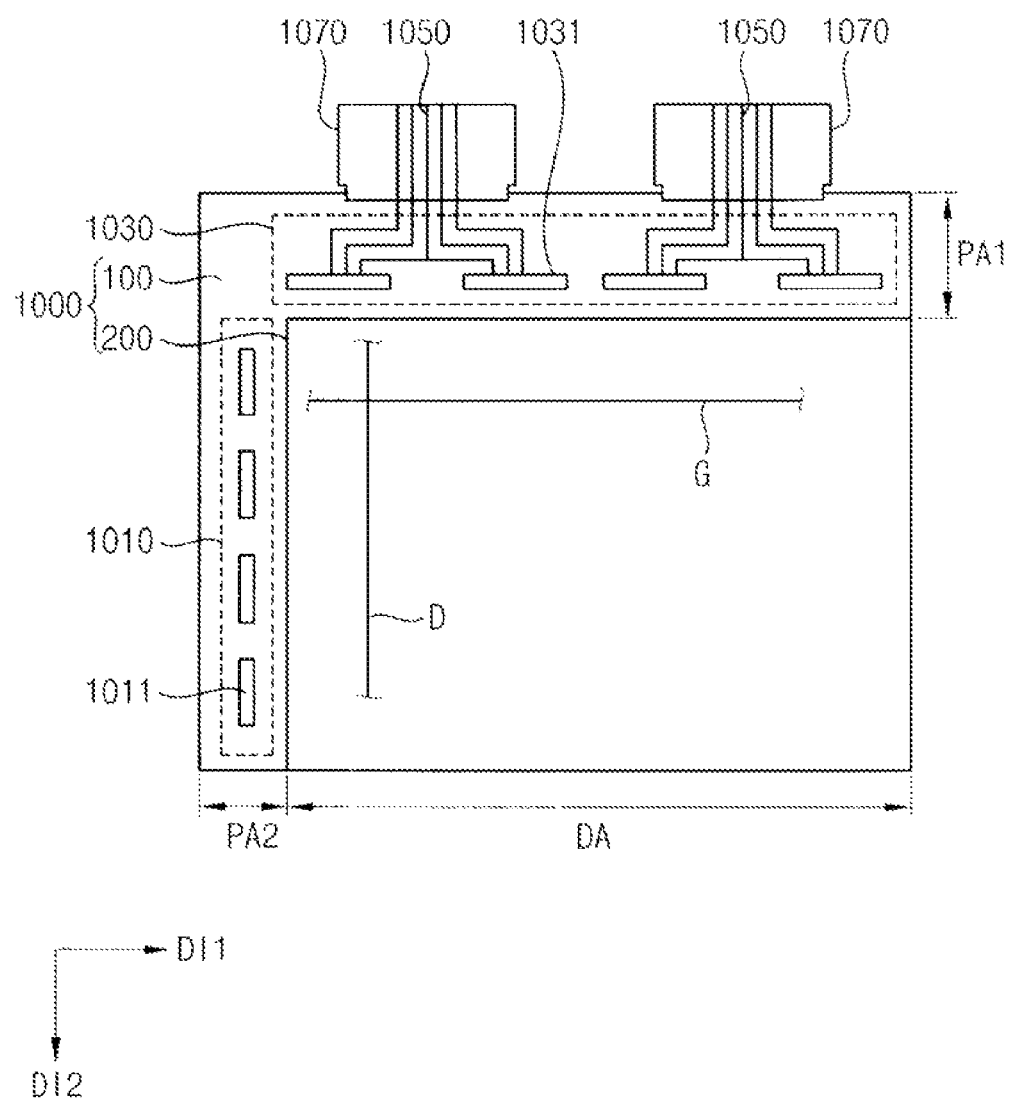
FIG. 1 is a plan view illustrating a display device according to Example Embodiment 1 of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-sectional illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Example Embodiment 1

FIG. 1 is a plan view illustrating a display device according to Example Embodiment 1 of the present invention.

Referring to FIG. 1, a display device according to the present example embodiment includes a display panel 1000, a gate driving part 1010, and a data driving part 1030 for driving the display panel 1000.

The display panel 1000 includes a display substrate 100, an opposite substrate (i.e., a color filter substrate) 200 combined with the display substrate 100, and a liquid crystal layer (not shown) disposed between the display substrate 100 and the opposite substrate 200. In this case, the display panel 1000 includes a display area DA, a first peripheral area PA1 and a second peripheral area PA2. The first and second peripheral areas PA1 and PA2 may surround the display area DA.

A data line D transmitting a data signal and a gate line G transmitting a gate signal are formed on the display area DA. The gate line G extends in a first direction DI1, and the data line extends in a second direction DI2. The word "diagonal," as used herein, is used to refer to a diagonal direction with respect to the first direction DI1 and the second direction DI2, unless specified otherwise.

A first end portion of the data line D is positioned at the first peripheral area PA1, and a first end portion of the gate line G is positioned at the second peripheral area PA2. In FIG. 1, the second peripheral area PA2 is disposed at a left portion of the display panel 1000. Alternatively, the second peripheral area PA2 may be disposed at a right side of the display panel 1000.

The gate driving part 1010 may include a shift register including a plurality of stages connected to one other, and may sequentially output the gate signal to the gate lines G. The gate driving part 1010 may include at least one gate driving chip 1011. The gate driving part 1010 may be formed in the second peripheral area PA2. In some embodiments, the gate driving part 1010 may also be integrated in the second peripheral area PA2. This way, additional space for mounting parts is not necessary so that a slim-type display device may be realized.

Alternatively, the gate driving chip 1011 may be mounted on a tape carrier package (TCP) disposed between a printed circuit board (not shown) and the display panel 1000.

The data driving part 1030 outputs an analogue data signal to the data line D in synchronization with the gate signal. The data driving part 1030 may include at least one data driving chip 1031.

The data driving chip 1031 may be directly attached in the first peripheral area PA1 of the display panel 100 as a chip-on-glass (COG) type. The data driving chip 1031 may share a power wire 1050 through a flexible film 1070.

The power wire 1050 may extend to the gate driving chip 1011. Although not shown in FIG. 1, the power wire 1050 extending from the data driving chips 1031 may be disposed to be electrically connected to the gate driving chip 1011.

Figure 2:
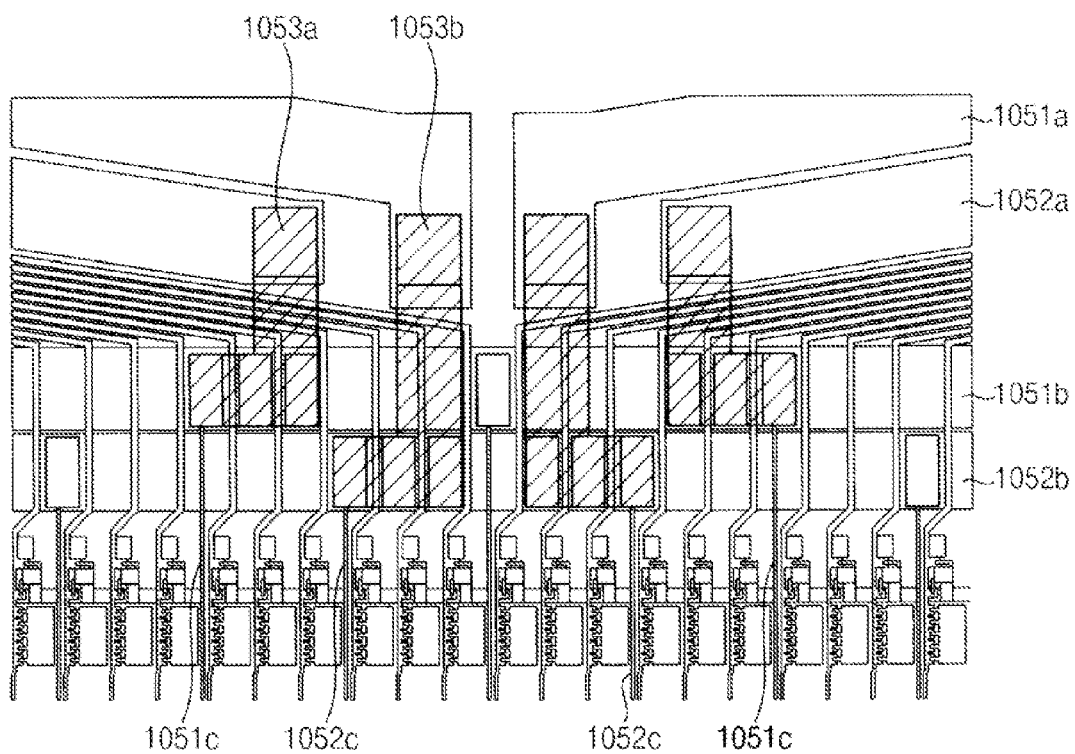
FIG. 2 is a layout view illustrating a power line of FIG. 1.

FIG. 2 is a layout view illustrating a power line of FIG. 1.

Referring to FIGS. 1 and 2, the power wire 1050 may include a first power line 1051*a* and a second power line 1052*a*.

The first power line 1051*a* is electrically connected to a fourth power line 1052*b* extending in the first direction DI1 through a second bridge 1053*b*. The second power line 1052*a* is electrically connected to a third power line 1051*b* through a first bridge 1053*a*.

First sub-power lines 1051*c*, which are disposed in correspondence with a plurality of pixels arranged in the first direction DI1, extend from the third power line 1051*b* in the second direction DI2 to apply predetermined voltages to the pixels. Second sub-power lines 1052*c*, which are disposed in correspondence with a plurality of pixels arranged in the first direction DI1, extend from the fourth power line 1052*b* in the second direction DI2 to apply predetermined voltages to the pixels.

The third power line 1051*b* and the fourth power line 1052*b* extend in the first direction DI1 through the display panel 1000. In addition, each of the third power lines 1051*b* and each of the fourth power lines 1052*b* are disposed in the first direction DI1 for each one of the gate lines.

Although not shown, the first power line 1051*a* and the second power line 1052*a* of the power wire 1050 may extend to the gate driving chip 1011 disposed on the second peripheral area PA2. Thus, the third power lines 1051*b* extending in the first direction DI1 may be electrically connected to the second power lines 1052*a* extending in the second direction DI2 at one end portion of the display panel 1000. In addition, the fourth power lines 1052*b* extending in the first direction DI1 may be electrically connected to the first power lines 1051*a* extending in the second direction DI2 at one end portion of the display panel 1000.

Figure 3:
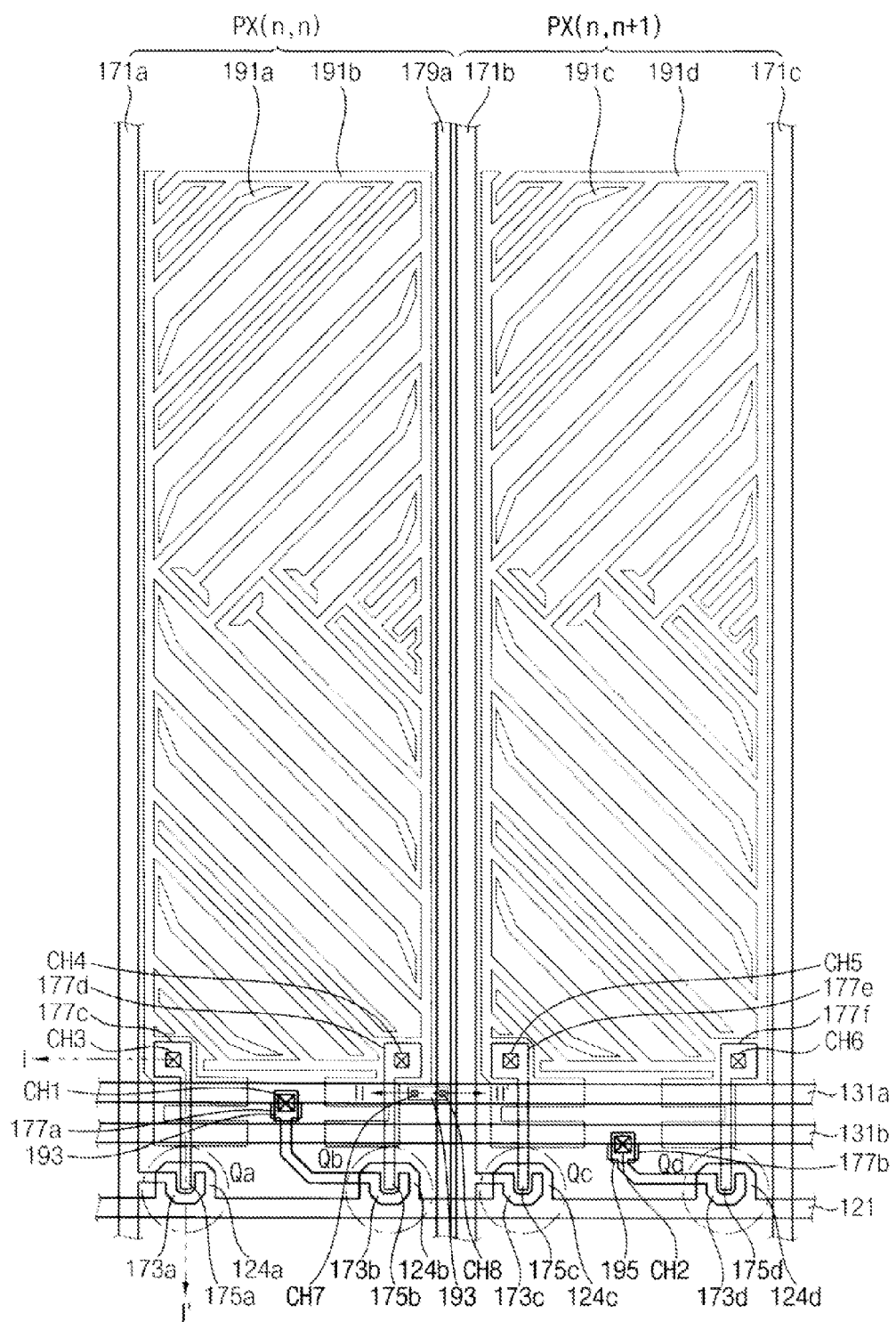
FIG. 3 is a plan view illustrating a display panel of FIG. 1.
Figure 4:
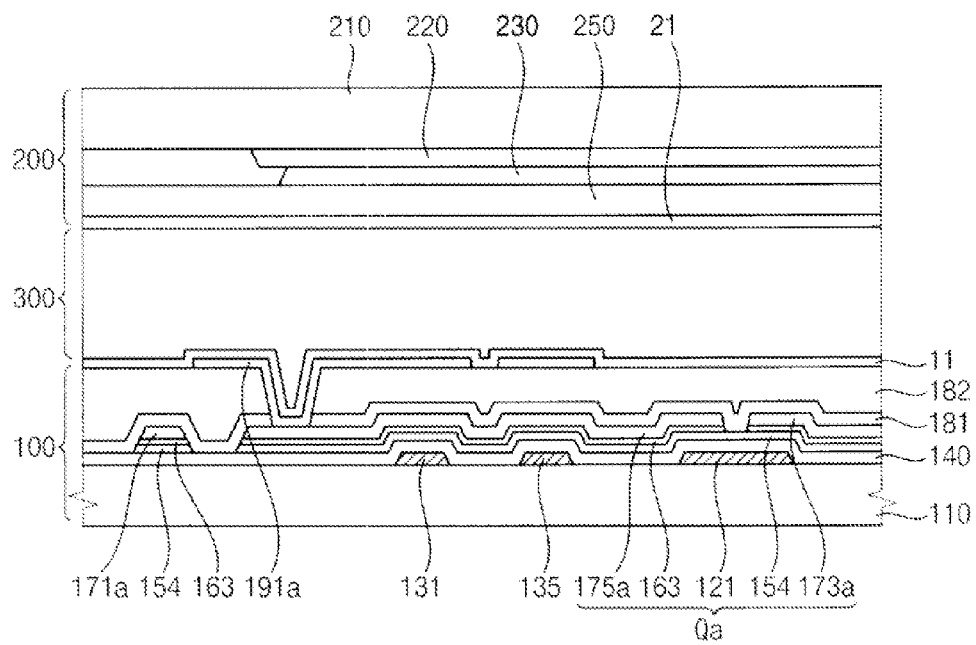
FIG. 4 is a cross-sectional view taken along a line I-I' in FIG. 3.
Figure 5:
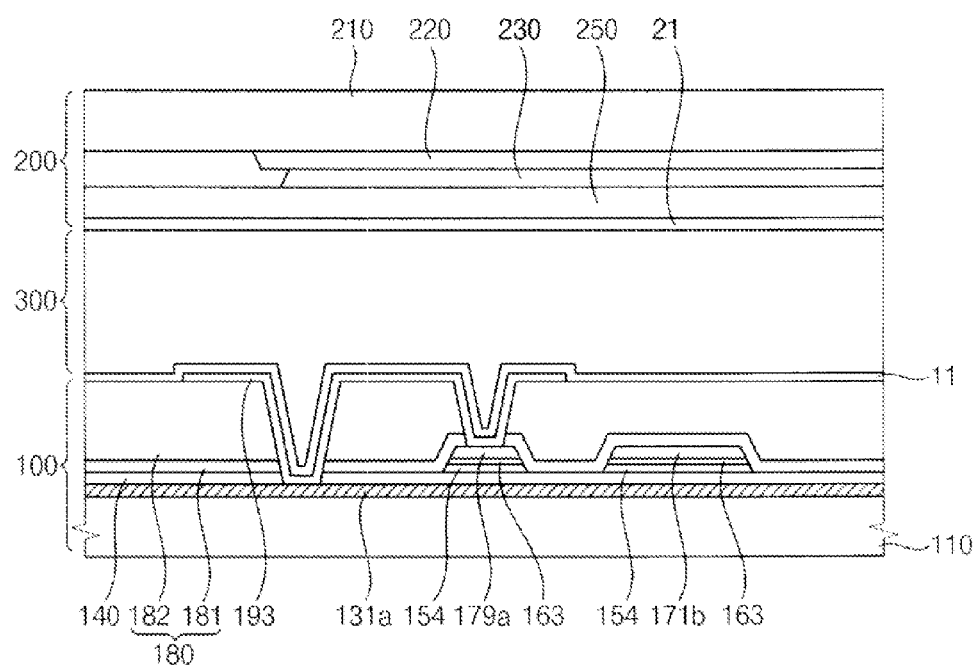
FIG. 5 is a cross-sectional view taken along a line II-II' in FIG. 3.

FIG. 3 is a plan view illustrating a display panel of FIG. 1. FIG. 4 is a cross-sectional view taken along a line I-I' in FIG. 3. FIG. 5 is a cross-sectional view taken along a line II-II' in FIG. 3.

Referring to the embodiment of FIGS. 3 through 5, the display panel includes a display substrate 100, an opposite substrate 200 and a liquid crystal layer 300.

The display substrate 100 includes a first base substrate 110. A plurality of pixel regions P is defined in the first base substrate 110. In FIG. 3, a first pixel area PX(n,n) and a second pixel area PX(n,n+1) of the display panel are illustrated, wherein 'n' is a natural number.

A gate metal layer is formed on the first base substrate 110. The gate metal layer may include a gate line 121, a first power line 131*a* and a third power line 131*b*.

The gate line 121 extends in the first direction DI1 to transmit a gate signal. Each of the gate lines 121 includes a first gate electrode 124*a*, a second gate electrode 124*b*, a third gate electrode 124*c* and a fourth gate electrode 124*d* that extend in plan view (e.g., FIG. 3).

Each of the first through fourth gate electrodes 124*a*, 124*b*, 124*c* and 124*d* has a polygonal shape. However, this is not a limitation and each of the first through fourth gate electrodes 124*a*, 124*b*, 124*c* and 124*d* may have alternative suitable shapes and arrangements.

The first power line 131*a* and the third power line 131*b* receive predetermined voltages such as a first voltage, a second voltage, etc. The first and third power lines 131*a* and 131*b* extend in the first direction DI1 in plan view. In this case, the first and third power lines 131*a* and 131*b* may receive voltages that are different from each other.

A gate insulation layer 140 is formed on the first base substrate 110 to cover the gate line 121, the first and third power lines 131*a* and 131*b*, and the first, second, third and fourth gate electrodes 124*a*, 124*b*, 124*c* and 124*d*. The gate insulation layer may contain silicon nitride (SiNx) or silicon oxide (SiOx).

A semiconductor layer 154 is formed on the gate insulation layer 140. The semiconductor layer 154 may include hydrogenated amorphous silicon, polycrystalline silicon, oxide semiconductor, etc. The semiconductor layer 154 is formed on the first to fourth gate electrodes 124*a*, 124*b*, 124*c* and 124*d*.

An ohmic contact layer 163 is formed on the semiconductor layer 154. The ohmic contact layer 163 may include n+ hydrogenated amorphous silicon that is implanted by n type impurities at a high concentration, silicide, etc. A pair of ohmic contact layers 163 are separately formed within each of first, second, third and fourth switching elements Qa, Qb, Qc and Qd.

A data metal layer is formed on the first base substrate 110 that has the ohmic contact layer 163 formed thereon. The data metal layer includes a first data line 171a, a second data line 171b, a third data line 171c, a first source electrode 173a, a second source electrode 173b, a third source electrode 173c, a fourth source electrode 173d, a first drain electrode 175a, a second drain electrode 175b, a third drain electrode 175c and a fourth drain electrode 175d.

In this case, the first, second and third data lines 171a, 171b and 171c, the first to fourth source electrodes 173a, 173b, 173c and 173d, and the first to fourth drain electrodes 175a, 175b, 175c and 175d may be simultaneously patterned through one mask.

The first, second and third data lines 171a, 171b and 171c transmit data signals. The first, second and third data lines 171a, 171b and 171c extend in the second direction D12 crossing the gate line 121 and the first and third power lines 131a and 131b. The first and second data lines 171a and 171b may receive voltages different from each other. Similarly, the second and third data lines 171b and 171c may receive voltages different from each other.

A second power line 179a, which is electrically connected to the first power line 131a, is formed on the first pixel area PX(n,n) close to the second data line 171b. Although not shown in FIG. 3, a plurality of data lines may be disposed between the second power line 179a and a fourth power line electrically connected to the third power line 131b. In this case, widths of the second power line 179a and the fourth power line may be smaller than widths of the first, second and third data lines 171a, 171b and 171c.

The first and third source electrodes 173a and 173c extend from the first and second data lines 171a and 171b, respectively, and have a U-shape bent toward the first and third gate electrodes 124a and 124c, respectively. Similarly, the second and fourth source electrodes 173b and 173d extend from the first and third power lines 131a and 131b, respectively, and have a U-shape bent toward the second and fourth gate electrodes 124b and 124d, respectively. In the present example embodiment, the first to fourth source electrodes 173a, 173b, 173c and 173d have a U-shape, but alternative example embodiments are not limited thereto. For example, the first to fourth source electrodes 173a, 173b, 173c and 173d may have an I-shape to be in parallel with the first drain electrode 175a, the second drain electrode 175b, the third drain electrode 175c and the fourth drain electrode 175d, respectively.

The second source electrode 173b extends toward the first power line 131a. A first source contact electrode 177a is formed at a first end portion of the second source electrode 173b to be connected electrically to the first power line 131a through a first contact hole CH1.

The fourth source electrode 173d extends toward the third power line 131c. A second source contact electrode 177b is formed at a first end portion of the fourth source electrode 173d to be connected electrically to the third power line 131b through a second contact hole CH2.

An end portion of a rod shape of each of the first, second, third and fourth drain electrodes 175a, 175b, 175c and 175d is surrounded by each of the first, second, third and fourth source electrodes 173a, 173b, 173c and 173d that is bent to form a U shape at the first, second, third and fourth gate electrodes 124a, 124b, 124c and 124d, respectively.

The first to fourth gate electrodes 124a, 124b, 124c and 124d, the first to fourth source electrodes 173a, 173b, 173c and 173d, and the first to fourth drain electrodes 175a, 175b, 175c and 175d may form the first, second, third and fourth switching elements Qa, Qb, Qc and Qd together with the semiconductor layer 154.

In this case, channels of the first to fourth switching elements Qa, Qb, Qc and Qd are formed in the semiconductor layer 154 between the first to fourth source electrodes 173a, 173b, 173c and 173d, and the first to fourth drain electrodes 175a, 175b, 175c and 175d, respectively.

The ohmic contact layer 163 is interposed between the semiconductor layer 154 and the first to fourth source electrodes 173a, 173b, 173c and 173d to decrease contact resistance between the semiconductor layer 154 and the first to fourth source electrodes 173a, 173b, 173c and 173d. Similarly, the ohmic contact layer 163 is interposed between the semiconductor layer 154 and the first to fourth drain electrodes 175a, 175b, 175c and 175d to decrease contact resistance between the semiconductor layer 154 and the first to fourth drain electrodes 175a, 175b, 175c and 175d.

A first drain contact electrode 177c expanding from the first drain electrode 175a is connected to a first pixel electrode 191a through a third contact hole CH3.

A second drain contact electrode 177d expanding from the second drain electrode 175b is connected to a second pixel electrode 191b through a fourth contact hole CH4.

A third drain contact electrode 177e expanding from the third drain electrode 175c is connected to a third pixel electrode 191c through a fifth contact hole CH5.

A fourth drain contact electrode 177f expanding from the fourth drain electrode 175d is connected to a fourth pixel electrode 191d through a sixth contact hole CH6.

A data insulation layer 180 is formed on the gate insulation layer 140 to cover the first to third data lines 171a, 171b and 171c, the first to fourth source electrodes 173a, 173b, 173c and 173d, and the first to fourth drain electrodes 175a, 175b, 175c and 175d.

The data insulation layer 180 may include an inorganic insulation layer 181 and an organic insulation layer 182. The inorganic insulation layer 181 may be formed on the gate insulation layer 140 to cover the first to third data lines 171a, 171b and 171c, the first to fourth source electrodes 173a, 173b, 173c and 173d, and the first to fourth drain electrodes 175a, 175b, 175c and 175d. The organic insulation layer 182 may be formed on the inorganic insulation layer 181.

The first through sixth contact holes CH1 through CH6 are formed through the data insulation layer 180 to the first and second source contact electrodes 177a and 177b and the first through fourth drain contact electrodes 177c through 177f, which would be temporarily exposed. In this case, the first and second contact holes CH1 and CH2 may include holes formed through the gate insulation layer 140 to expose the first and third power lines 131a and 131b during manufacturing.

The first to fourth pixel electrodes 191a, 191b, 191c and 191d, a first transparent electrode 193 and a second transparent electrode 195 are formed on the data insulation layer 180 by using a transparent conductive material such as indium tin oxide (ITO), indium zinc oxide (IZO), etc.

The first and third pixel electrodes 191a and 191c receive voltages different from each other from the first and second data lines 171a and 171b.

The second and fourth pixel electrodes 191b and 191d receive voltages different from each other from the first and third power lines 131a and 131b.

When a driving voltage is applied to the first to fourth pixel electrodes 191a to 191d, electric fields are formed between the first and second pixel electrodes 191a and 191b, and between the third and fourth pixel electrodes 191c and 191d.

When the electric field is formed between the first and second pixel electrodes 191a and 191b, various gray-scale levels may be realized. When this happens, a voltage of the first data line 171a may be adjusted in accordance with the gray-scale level.

In addition, when the electric field is formed between the third and fourth pixel electrodes 191c and 191d, various gray-scale levels may be realized. When this happens, a voltage of the second data line 171b may be adjusted in accordance with the gray-scale level.

The first pixel electrode 191a includes first electrode bars and the second pixel electrode 191b includes second electrode bars, so that the first electrode bars extend between the second electrode bars. In a sense, the first and second electrode bars are alternately disposed. Although there is no limitation to the shape of the first and second electrode bars, they may each be a network of straight lines branching from a main bar, as in the embodiment of FIG. 3 described below. Moreover, the third pixel electrode 191c includes third electrode bars and the fourth pixel electrode 191d includes fourth electrode bars, so that the third electrode bars and the fourth electrode bars are alternately disposed (i.e., the third electrode bars extend between the fourth electrode bars).

For example, the first pixel electrode 191a and the third pixel electrode 191c are electrically connected to the first and third drain electrodes 175a and 175c, respectively. The first pixel electrode 191a and the third pixel electrode 191c include a first bar extending in the second direction DI2, and a first branch part extending from the first bar. The first branch part extends substantially diagonally with respect to the first bar. More specifically, the first branch parts extending from one side of the first bar extend in a first diagonal direction with respect to the first bar, and the first branch parts extending from another side of the first bar extend in a second diagonal direction with respect to the first bar. The two types of diagonal branch parts meet near a middle portion of the first bar to form a "V," as shown in FIG. 3. The first diagonal direction may form an angle of about 45 degrees or about 225 degrees with respect to the gate line 121. The second diagonal direction may form an angle of 135 degrees or about 315 degrees with respect to the gate line 121.

The second pixel electrode 191b and the fourth pixel electrode 191d are electrically connected to the second and fourth drain electrodes 175b and 175d, respectively. The second pixel electrode 191b and the fourth pixel electrode 191d include a second bar extending in the second direction DI2, and a second branch part extending from the second bar. The second branch part extends substantially diagonally with respect to the first bar. More specifically, the second branch parts extending from one side of the second bar extend in a first diagonal direction with respect to the second bar, and the first branch parts extending from another side of the first bar extend in a second diagonal direction with respect to the second bar. The two types of diagonal branch parts meet near a middle portion of the second bar to form a "V." The first diagonal direction may form an angle of about 45 degrees with respect to the gate line 121. The second diagonal direction may form an angle of about 135 degrees with respect to the gate line 121.

The first and second branch parts in each of the first and second pixel areas PX(n,n) and PX(n,n+1) extend alternating with each other.

The first transparent electrode 193 electrically connects the first power line 131a at the base of the first contact hole CH1 and the second source electrode 173b exposed through the first contact hole CH1. In addition, the first transparent electrode 193 may also electrically connect the first power line 131a and the second power line 179a.

A seventh contact hole CH7 is formed through the gate insulation layer 140 and the data insulation layer 180 formed over the first power line 131a in a close area to the second power line 179a, so that the seventh contact hole CH7 extends to the first power line 131a. An eighth contact hole CH8 is formed through the data insulation layer 180 formed on the second power line 179a in a close area to the first power line 131a, so that the eighth contact hole CH8 extends to the second power line 179a. The first transparent electrode 193 makes contact with the first power line 131a and the second power line 179a through the seventh and eighth contact holes CH7 and CH8. Thus, the first power line 131a and the second power line 179a may be electrically connected to each other.

The second transparent electrode 195 electrically connects the third power line 131b at the bottom of the second contact hole CH2 and the fourth source electrode 173d exposed through the second contact hole CH2. Although not shown, the fourth power line may be electrically connected to the third power line 131b through the second transparent electrode 195.

In the present embodiment, the first pixel and the second pixel have rectangular shapes; however, the first pixel and the second pixel may have other shapes, as will be described below (e.g., chevron shape, asymmetric double-chevron shape).

A lower alignment layer 11 is formed on the first base substrate 110 including the first to fourth pixel electrodes 191a to 191d to align liquid crystal molecules of the liquid crystal layer 300 in a vertical direction ("vertical" meaning substantially orthogonal to the base substrate 110). Thus, the liquid crystal molecules of the liquid crystal layer 300 are aligned to extend from the display substrate 100 toward the opposite substrate 200.

The opposite substrate 200 faces the display substrate 100.

The opposite substrate 200 includes a second base substrate 210, a light-blocking pattern 220, a color filter pattern 230, an overcoating layer 250 and an upper alignment layer 21.

The light-blocking pattern 220 may prevent leakage of lights between the first and second pixel areas PX(n,n) and PX(n,n+1), and define an opening region corresponding to the first and second pixel areas PX(n,n) and PX(n,n+1). The color filter pattern 230 is formed in the opening region defined by the light-blocking pattern 220.

The color filter pattern 230 may include a red color filter, a green color filter and a blue color filter. The overcoating layer 250 covers the color filter pattern 230 and the light-blocking pattern 220.

In the present embodiment, the light-blocking pattern 220 and the color filter pattern 230 are formed in the opposite substrate 200. However, the light-blocking pattern 220 may be formed in the display substrate 100 in other embodiments.

The overcoating layer 250 is formed on the light-blocking pattern 220 and the color filter pattern 230. The overcoating layer 250 may include an insulation material such as acrylate resin. The overcoating layer 250 may have a substantially flat surface to cover the color filter 230. In some embodiments, the overcoating layer 250 may be omitted.

The upper alignment layer 21 is formed on the overcoating layer 250 to align the liquid crystal molecules of the liquid crystal layer 300 in the vertical direction.

The liquid crystal layer 300 is interposed between the display substrate 100 and the opposite substrate 200. The liquid crystal layer 300 includes the liquid crystal molecules having positive dielectric anisotropy. In the absence of an electric field, the liquid crystal molecules are vertically aligned with respect to the surfaces of the display substrate 100 and the opposite substrate 200.

The arrangement of the liquid crystal molecules of the liquid crystal layer 300 changes in response to the electric field formed between the first and second pixel electrodes 191a and 191b and the electric field formed between the third and fourth pixel electrodes 191c and 191d. Light transmittance of the liquid crystal layer 300 changes with the alignment of the liquid crystal molecules.

For example, when different voltages are applied to the first and second pixel electrodes 191a and 191b and different voltages are applied to the third and fourth pixel electrodes 191c and 191d, an electric field substantially parallel to the surfaces of the display substrate 100 and the opposite substrate 200 may be formed. In this case, the display panel 1000 is driven in white mode. When identical voltages are applied to the first and second pixel electrodes 191a and 191b and identical voltages are applied to the third and fourth pixel electrodes 191c and 191d, no electric field forms at the surfaces of the display substrate 100 and the opposite substrate 200. In this case, the display panel 1000 is driven in black mode.

The vertically aligned liquid crystal molecules of the liquid crystal layer 300 (i.e., vertical with respect to the display substrate 100 and the opposite substrate 200) change their arrangement, so that the liquid crystal molecules are inclined toward the horizontal direction substantially parallel to the direction of the electric field. Thus, polarizing characteristics of the liquid crystal layer 300 change, affecting the light transmittance of the liquid crystal layer 300 and thereby displaying an image.

When the display device uses the vertically aligned liquid crystal molecules, contrast ratio and viewing angle of the display device are improved. Also, two different voltages having opposite polarities with respect to a common voltage are applied to the first and second pixel areas PX(n,n) and PX(n,n+1) so that driving voltage of the switching elements Qa, Qb, Qc and Qd and the response speed of the liquid crystal molecules are improved.

Figure 6A:
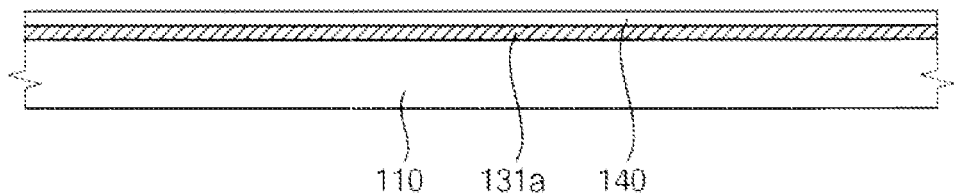
FIGS. 6A through 6C are cross-sectional views showing a method of manufacturing a display substrate of FIG. 3.
Figure 6B:
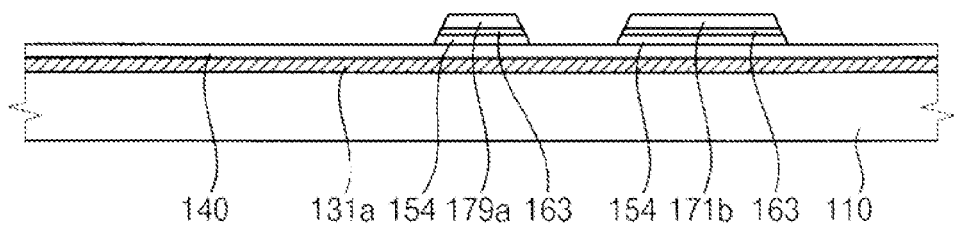
Figure 6C:
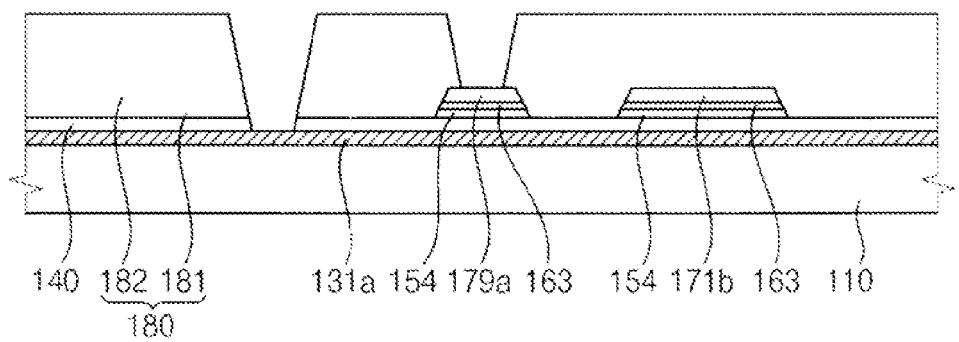

FIGS. 6A through 6C are cross-sectional views showing a method of manufacturing a display substrate of FIG. 3.

Referring to FIGS. 5 and 6A, the gate line 121, the first power line 131a, and the third power line 131b extending in the first direction DI1 are formed on the first base substrate 110, and the first to fourth gate electrodes 124a to 124d of the first to fourth switching elements Qa to Qd are formed on the first base substrate 110. Thereafter, the gate insulation layer 140 is formed.

Referring to FIGS. 5 and 6B, the first to third data lines 171a to 171c, the first to fourth source electrodes 173a to 173d, the first to fourth drain electrodes 175a to 175d, the second power line 179a and the fourth power line (not shown) are formed on the first base substrate 110 that has the gate line 121, the first power line 131a, the third power line 131b, and the first to fourth gate electrodes 124a to 124d thereon. In this case, the second power line 179a and the fourth power line are formed in the second direction DI2.

Referring to FIGS. 3, 5 and 6C, the data insulation layer 180 is formed on the first base substrate 110 on which the first to third data lines 171a to 171c, the first to fourth source electrodes 173a to 173d, the first to fourth drain electrodes 175a to 175d, the second power line 179a, and the fourth power line are formed. Then, the seventh contact hole CH7 and the eighth contact hole CH8 are formed through the data insulation layer 180 so that the first transparent electrode 193 makes a connection between the first power line 131a and the second power line 179a.

Referring to FIGS. 3 and 5, the first pixel electrode 191a, the second pixel electrode 191b and the first transparent electrode 193 are formed on the data insulation layer 180 having the seventh contact hole CH7 and the eighth contact hole CH8 formed therethrough. The first pixel electrode 191a is electrically connected to the first data line 171a. The first pixel electrode 191a includes a plurality of first electrode bars. The second pixel electrode 191b is electrically connected to the first power line 131a. The second pixel electrode 191b includes a plurality of second electrode bars which extend between the first electrode bars. The first transparent electrode 193 connects the first power line 131a and the second power line 179a.

The third pixel electrode 191c, the fourth pixel electrode 191d and the second transparent electrode 195 are formed. The third pixel electrode 191c is connected to the second data line 171b to include a plurality of third electrode bars. The fourth pixel electrode 191d is connected to the third power line 131b to include a plurality of fourth electrode bars that extend between the third electrode bars. The second transparent electrode 195 connects the third power line 131b and the fourth power line 179b.

Figure 7:
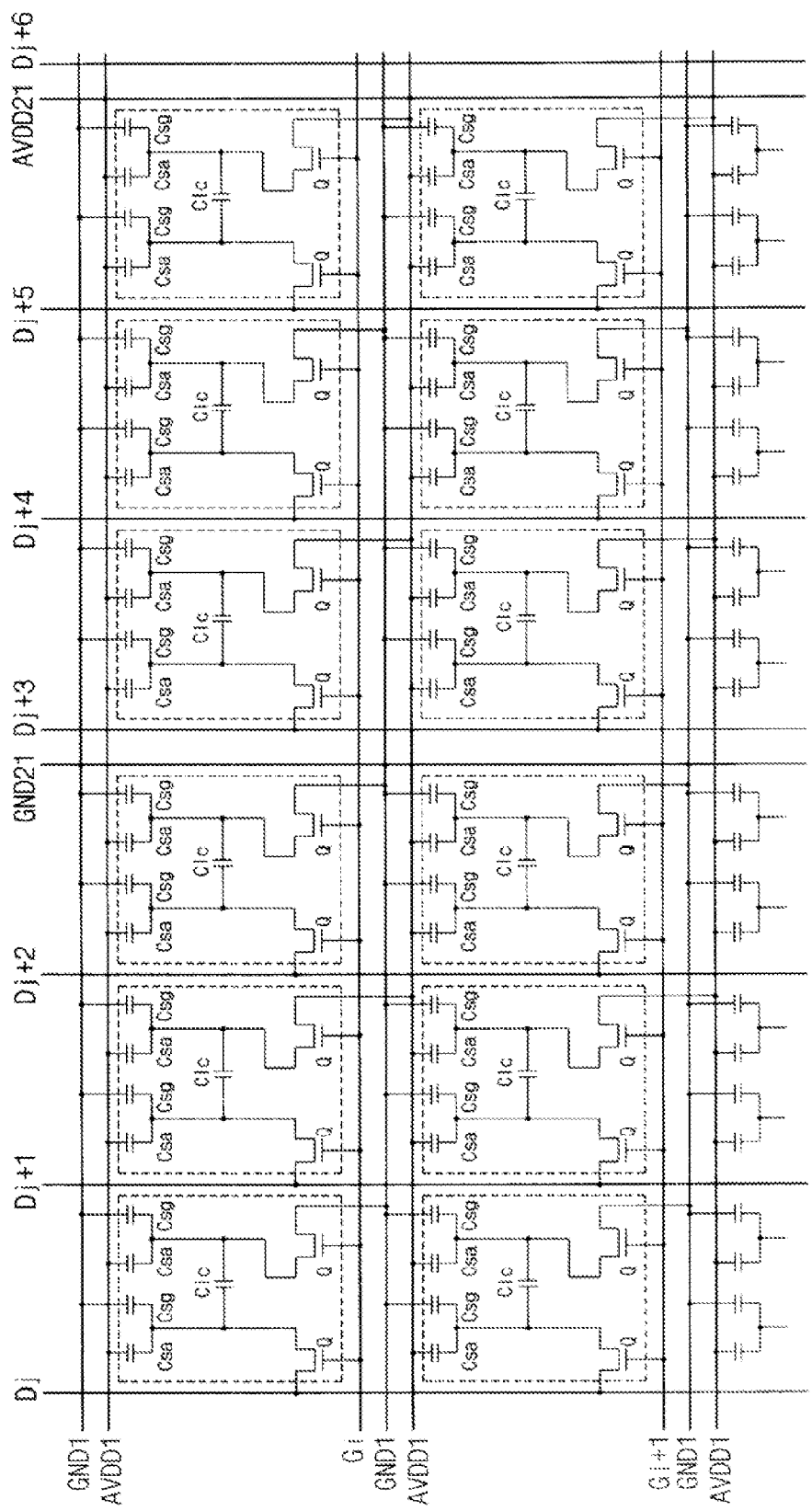
FIG. 7 is an equivalent circuit diagram illustrating the display panel shown in FIG. 3.

FIG. 7 is an equivalent circuit diagram illustrating the display panel shown in FIG. 3.

Referring to FIGS. 2 through 7, the display panel includes a plurality of signal lines Dj, Dj+1, Dj+2, Dj+3, Dj+4, Dj+5, Dj+6, Gi and Gi+1, a first ground line GND1, a first power supply line AVDD1, a second ground line GND21, and a second power supply line AVDD21. In this case, 'i' and 'j' are natural numbers.

The display panel includes a plurality of pixels electrically connected to the signal lines Dj, Dj+1, Dj+2, Dj+3, Dj+4, Dj+5, Dj+6, Gi and Gi+1, the first ground line GND1, the first power supply line AVDD1, the second ground line GND21, and the second power supply line AVDD21. The pixels are arranged in a matrix shape.

In this case, the first ground line GND1 and the first power supply line AVDD1 respectively represent the third power line 1051b and the fourth power line 1052b of FIG. 2. Moreover, the second ground line GND21 and the second power supply line AVDD21 respectively represent the first sub-power line 1051c and the second sub-power line 1052c.

In FIGS. 4 and 5, the display panel includes the display substrate 100, the opposite substrate 200 facing the display substrate 100, and the liquid crystal layer 300 interposed between the display substrate 100 and the opposite substrate 200.

The signal lines Dj, Dj+1, Dj+2, Dj+3, Dj+4, Dj+5, Dj+6, Gi and Gi+1 include an i-th gate line Gi, an (i+1)-th gate line Gi+1, a j-th data line Dj, a (j+1)-th data line Dj+1, a (j+2)-th data line Dj+2, a (j+3)-th data line Dj+3, a (j+4)-th data line Dj+4, a (j+5)-th data line Dj+5 and a (j+6)-th data line Dj+6. The i-th and (i+1)-th gate lines Gi and Gi+1 transmit a gate signal (or a scan signal). The j-th, (j+1)-th, (j+2)-th, (j+3)-th, (j+4)-th, (j+5)-th and (j+6)-th data lines Dj, Dj+1, Dj+2, Dj+3, Dj+4, Dj+5 and Dj+6 transmit a data voltage.

The i-th and (i+1)-th gate lines Gi and Gi+1, the first ground line GND1 and the first power supply line AVDD1 extend in the first direction DI1 and are substantially parallel to each other.

The j-th, (j+1)-th, (j+2)-th, (j+3)-th, (j+4)-th, (j+5)-th and (j+6)-th data lines Dj, Dj+1, Dj+2, Dj+3, Dj+4, Dj+5 and Dj+6, the second ground line GND21 and the second power supply line AVDD21 extend in the second direction DI2 and are substantially parallel to each other.

The second power line 179a of the display substrate 100 according to the present embodiment is disposed between adjacent pixels in the second direction DI2 in which the second data line 171b extends.

Two adjacent data lines of the j-th, (j+1)-th, (j+2)-th, (j+3)-th, (j+4)-th, (j+5)-th and (j+6)-th data lines Dj, Dj+1, Dj+2, Dj+3, Dj+4, Dj+5 and Dj+6 receive different voltages.

In the first pixel area PX(n,n) and the second pixel area PX(n,n+1), the (j+2)-th, (j+3)-th and (j+4)-th data lines Dj+2, Dj+3 and Dj+4 of FIG. 7 respectively may represent the first, second and third data lines 171a, 171b and 171c of FIG. 3.

The i-th gate line Gi of FIG. 7 represents the gate line 121 of FIG. 3. The first ground line GND 1, the first power supply line AVDD1 and the second ground line GND21 of FIG. 7 respectively represent the first power line 131a, the third power line 131b and the second power line 179a of FIG. 3. The second power supply line AVDD21 is not shown in FIG. 3. However, the second power supply line AVDD21 represents the fourth power line explained in FIG. 3. Additionally, the first and third switching elements Qa and Qc are respectively connected to the first and second data lines 171a and 171b, and the second and fourth switching elements Qb and Qd are respectively connected to the first and third power lines 131a and 131b.

Referring again to FIG. 7, the (j+2)-th data line Dj+2 and the (j+3)-th data line Dj+3 are respectively connected to the first and third switching elements Qa and Qc. Additionally, the first ground line GND 1 and the first power supply line AVDD 1 are respectively connected to the second and fourth switching elements Qb and Qd.

The second ground line GND21 and the second power supply line AVDD21 are respectively disposed close to the (j+3)-th data line Dj+3 and the (j+6)-th data line Dj+6. The first power supply line AVDD1 and the second power supply line AVDD21 are electrically connected to each other through the first transparent electrode 193 illustrated in FIG. 3, and the first ground line GND 1 and the second ground line GND21 are electrically connected to each other through the second transparent electrode 195 in FIG. 3.

Therefore, the second ground line GND21 and the second power supply line AVDD21 are connected to the power wire 1050 in the first peripheral area PA1 of FIG. 1. A plurality of second ground lines GND21 is connected to a plurality of first ground lines GND 1. A plurality of second power supply lines AVDD21 is connected to a plurality of first power supply lines AVDD1. Thus, delays of the first voltage and the second voltage may be reduced even though the power wire 1050 is not disposed on the second peripheral area PA2, so that the first and second voltages may be uniformly applied to the display area DA.

Moreover, the delays of the first voltage and the second voltage may be more reduced when the power wire 1050 is disposed on the second peripheral area PA2, so that the display quality may be more improved.

Referring again to FIGS. 3 and 7, the first power line 131a and the third power line 131b are overlapped with the first and second pixel electrodes 191a and 191b electrically connected to the first and second switching elements Qa and Qb to form storage capacitors Csa and Csg, respectively. Similarly, the first power line 131a and the third power line 131b are overlapped with the third and fourth pixel electrodes 191c and 191d electrically connected to the third and fourth switching elements Qc and Qd to form storage capacitors Csa and Csg, respectively.

The liquid crystal layer 300 in the first and second pixel areas PX(n,n) and PX(n,n+1) functions as a dielectric material of the liquid crystal capacitor Clc. The liquid crystal capacitor Clc is formed by the pixel electrodes and the liquid crystal layer 300.

The liquid crystal layer 300 has dielectric anisotropy. When the electric field is not applied to the liquid crystal layer 300, the liquid crystal molecules of the liquid crystal layer 300 are vertically aligned between the display substrate 100 and the opposite substrate 200.

Figure 8:
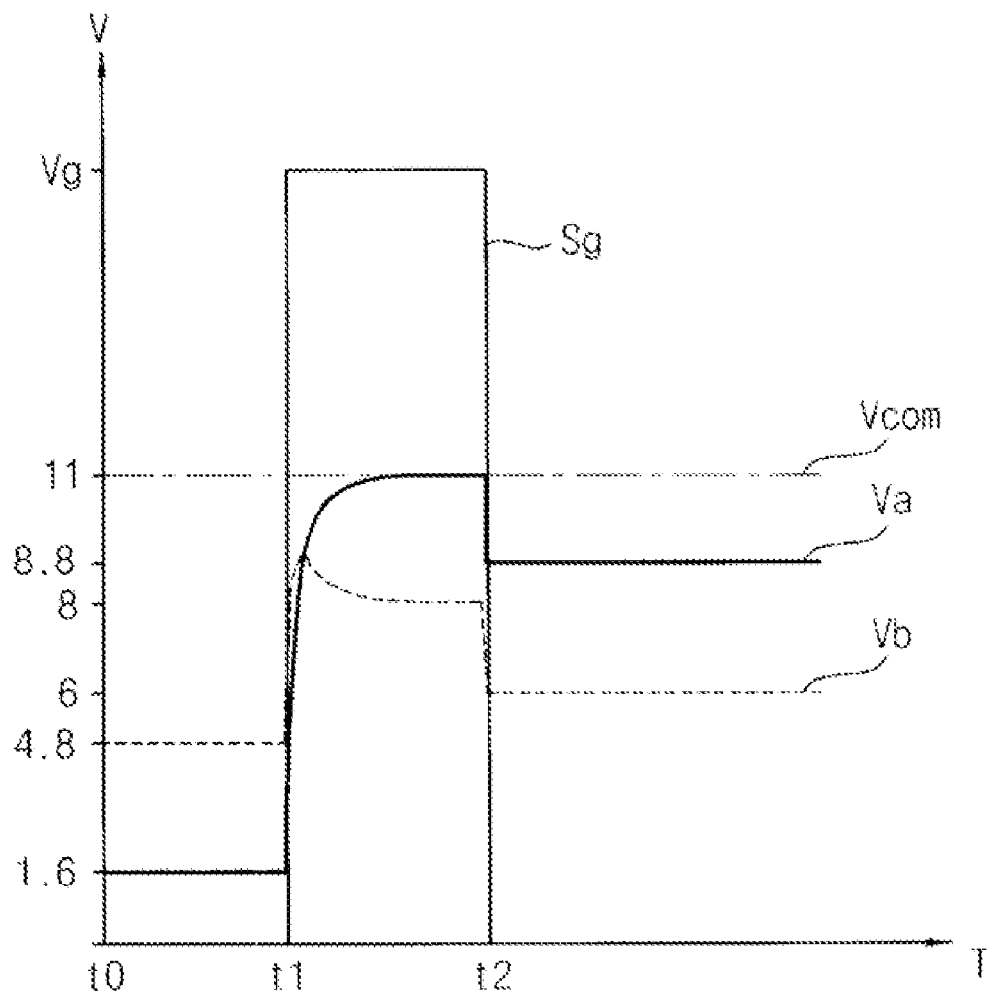
FIG. 8 is a waveform diagram illustrating voltages applied to the equivalent circuit shown in FIG. 7.

FIG. 8 is a waveform diagram illustrating voltages applied to the equivalent circuit shown in FIG. 7. In this case, X-axis represents time T and Y-axis represents voltage V.

Referring to FIGS. 3 and 8, from time t0 to t1 before the gate signal Sg applied to the gate line 121 is active, a voltage value Va of the first pixel electrode 191a is maintained at about 1.6 V and a voltage value Vb of the third pixel electrode 191c is maintained at about 4.8 V. The first pixel electrode 191a is charged to a voltage of about 11 V and the third pixel electrode 191c is charged to a voltage of about 8 V. Then, when the gate signal Sg applied to the gate line 121 is inactive at t2, the first pixel electrode 191a is discharged to and maintained at a voltage of about 8.8 V and the third pixel electrode 191c is discharged to and maintained at a voltage of about 6 V.

In this case, a voltage Vcom applied to the second pixel electrode 191b is maintained at about 11 V at all times.

According to the present embodiment, the second ground line GND21 and the second power supply line AVDD21 are connected to the first ground line GND 1 and the first power supply line AVDD1 that are disposed in the direction in which the gate lines Gi extend. The second ground line GND21 and the second power supply line AVDD21 are alternately disposed at multiple data lines (for example, three data lines), so that the delays of the first and second voltages may be reduced when the first and second voltages are transmitted through the display area. This way, the situation of the charge rate at one side of the display area being slower than the charge rate at another side of the display area may be avoided.

Example Embodiment 2

Figure 9:
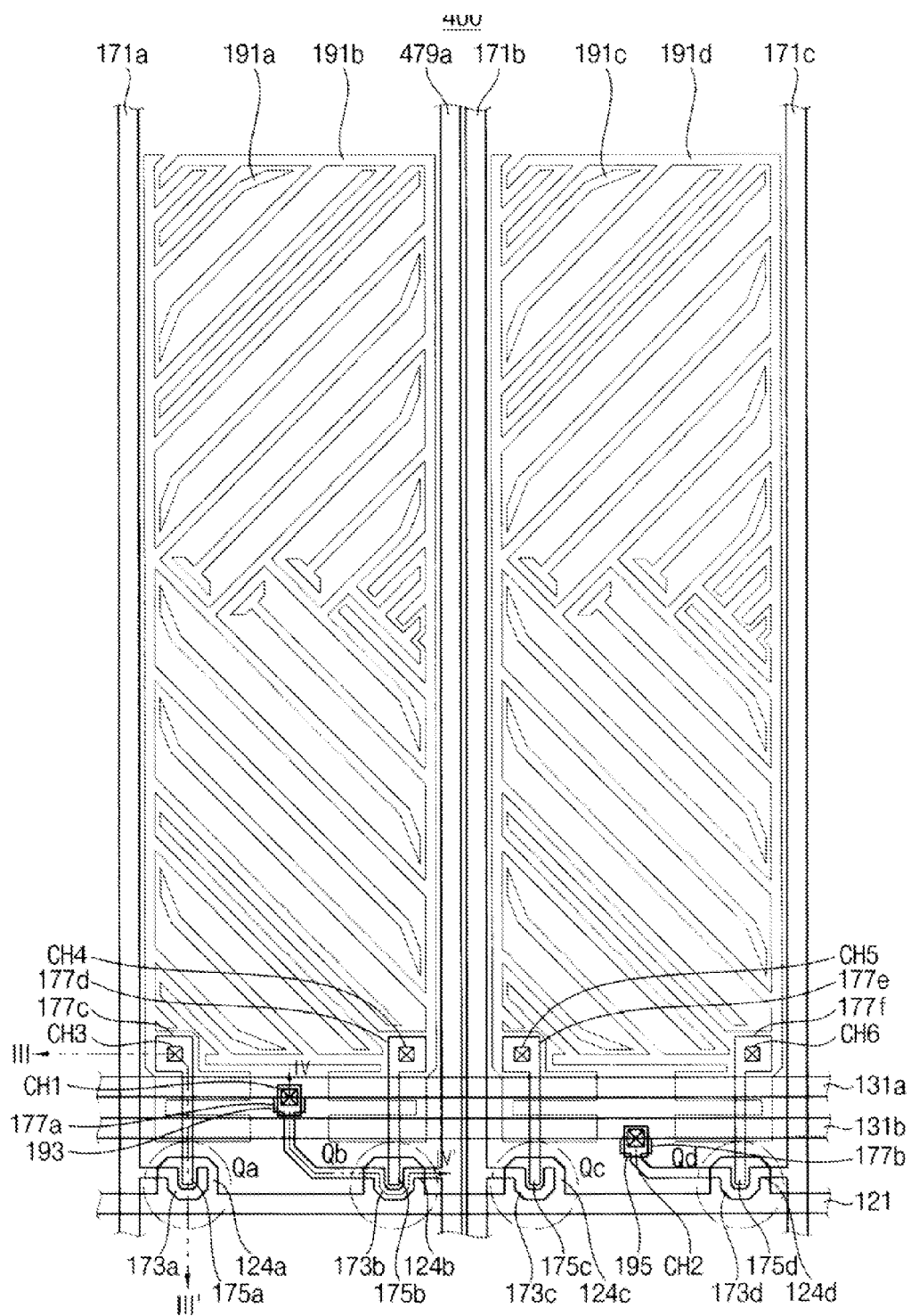
FIG. 9 is a plan view illustrating a display panel according to Example Embodiment 2 of the present invention.
Figure 10:
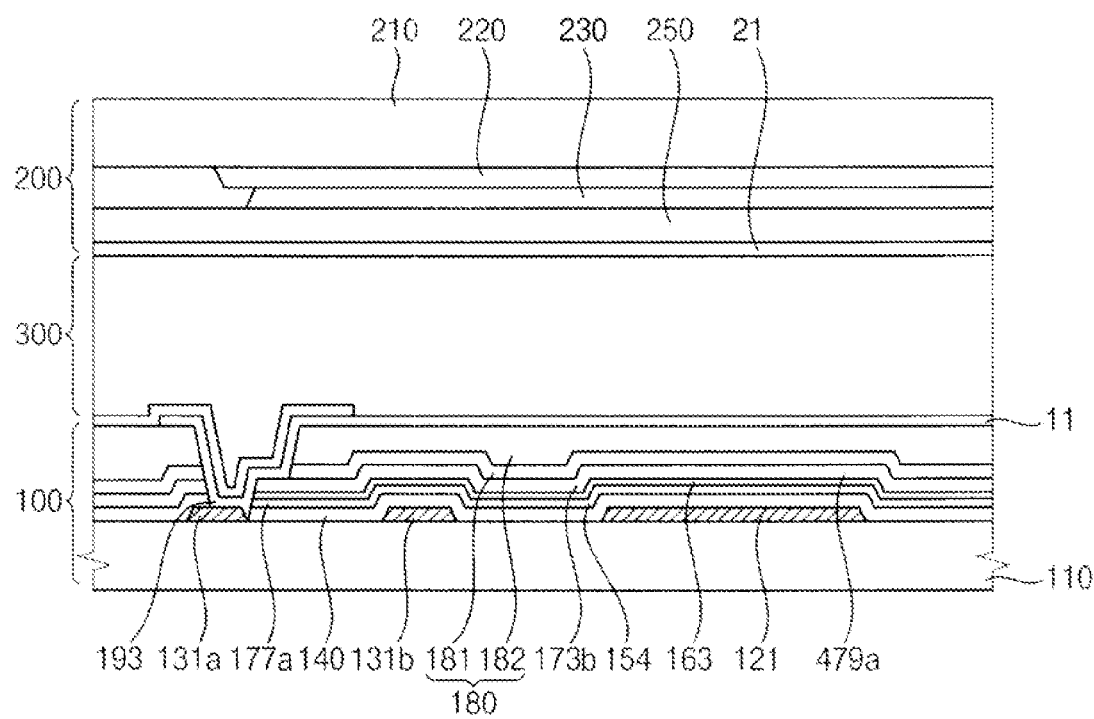
FIG. 10 is a cross-sectional view taken along a line IV-IV' in FIG. 9.

FIG. 9 is a plan view illustrating a display panel according to Example Embodiment 2 of the present invention. FIG. 10 is a cross-sectional view taken along a line IV-IV' in FIG. 9.

A cross-sectional view taken along a line III-III' in FIG. 9 is substantially the same as the cross-sectional view of FIG. 4. Thus, the cross-sectional view taken along the line III-III' in FIG. 9 will be omitted.

The display panel according to the present example embodiment is substantially the same as the display panel according to Example Embodiment 1 except that a second power line 479a and the first power line 131a are connected to the second source electrode 173b of the second switching element Qb. Thus, the same reference numerals will be used to designate the same elements, and any redundant explanation will be omitted.

Referring to FIGS. 9 and 10, the second power line 479a extends to the second source electrode 173b and is connected to the second source electrode 173b so that the second power line 479a is connected to the first power line 131a. For example, the second source electrode 173b is connected to the first power line 131 through the first contact hole CH1 so that the first power line 131a and the second power line 479a may be electrically connected to each other.

Figure 11A:
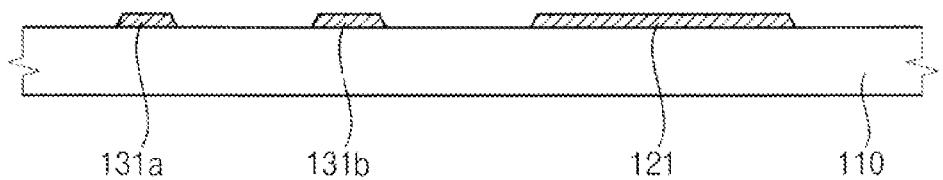
FIGS. 11A through 11C are cross-sectional views showing a method of manufacturing a display substrate of FIG. 9.
Figure 11B:
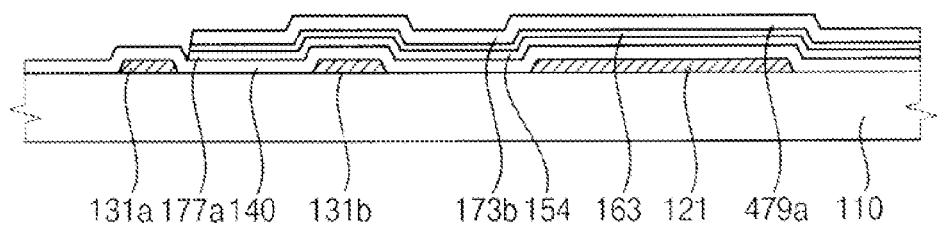
Figure 11C:
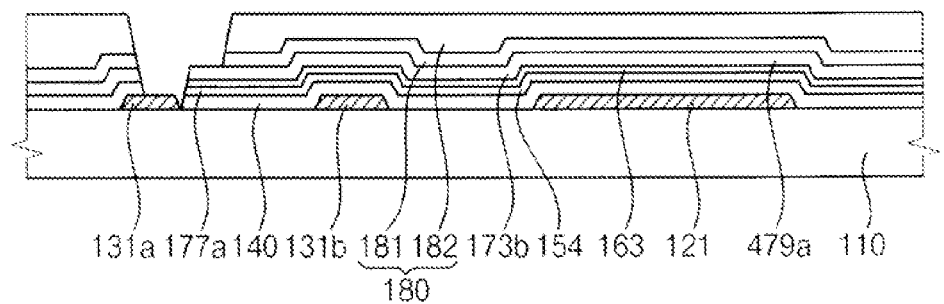

FIGS. 11A through 11C are cross-sectional views showing a method of manufacturing a display substrate of FIG. 9.

Referring to FIGS. 9 through 11C, the method of manufacturing the display substrate according to the present example embodiment is substantially the same as the method of FIGS. 6A through 6C according to Example Embodiment 1 except that the second power line 479a and the second source electrode 173b are connected to each other. Thus, the same reference numerals will be used to designate the same elements, and any redundant explanation will be omitted.

It is recognized that the first contact hole CH1 was formed so as to electrically connect the first power line 131a and the second source electrode 173b that is extended to the first power line 131a and does not makes contact with the first power line 131a. Thus, the second pixel electrode 191b makes contact with the second source electrode 173b and the first power line 131a so that the second source electrode 173b is connected to the first power line 131a.

Figure 12:
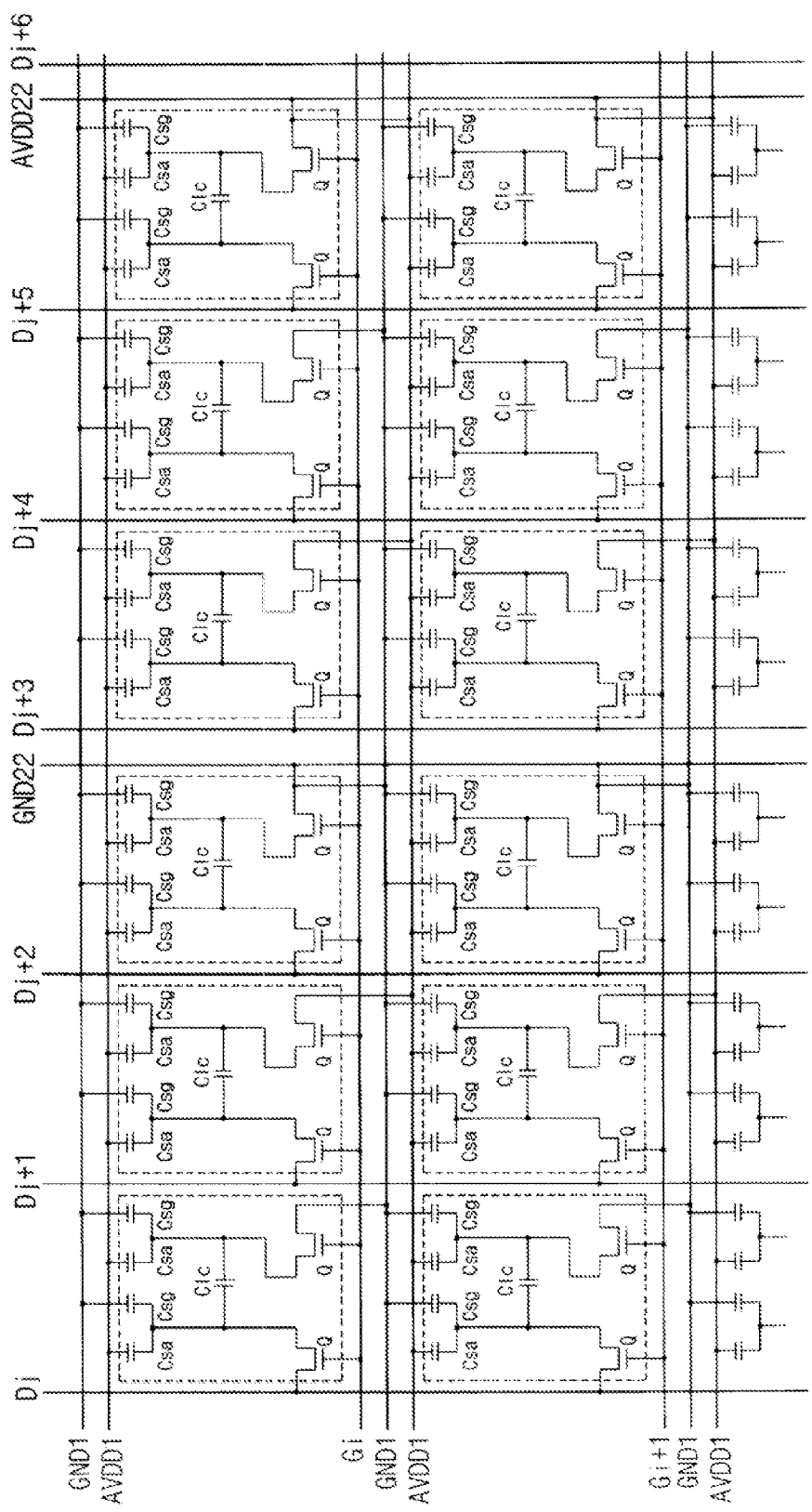
FIG. 12 is an equivalent circuit diagram illustrating the display panel shown in FIG. 9.

FIG. 12 is an equivalent circuit diagram illustrating the display panel shown in FIG. 9.

A waveform diagram illustrating voltages applied to the equivalent circuit shown in FIG. 12 is substantially the same as the waveform diagram of FIG. 8. Thus, the waveform diagram according to the present embodiment will be omitted.

Referring to FIGS. 9 and 12, the second power line 479a represents a second ground line GND22. Although not shown, the fourth power line explained in Example Embodiment 1 represents a second power supply line AVDD22.

In this case, the second power supply line AVDD22 and a source electrode 173b of the second switching element Qb are connected, and the source electrode 173b of the second switching element Qb and the first ground line GND 1 is connected. That is, the second ground line GND22 and the second power supply line AVDD22 are connected through source electrodes of the switching elements Q, which is different from the embodiment of FIG. 7. With this configuration, the seventh and eighth contact holes CH7 and CH8 are not needed. Thus, aperture ratio may be increased.

Example Embodiment 3

Figure 13:
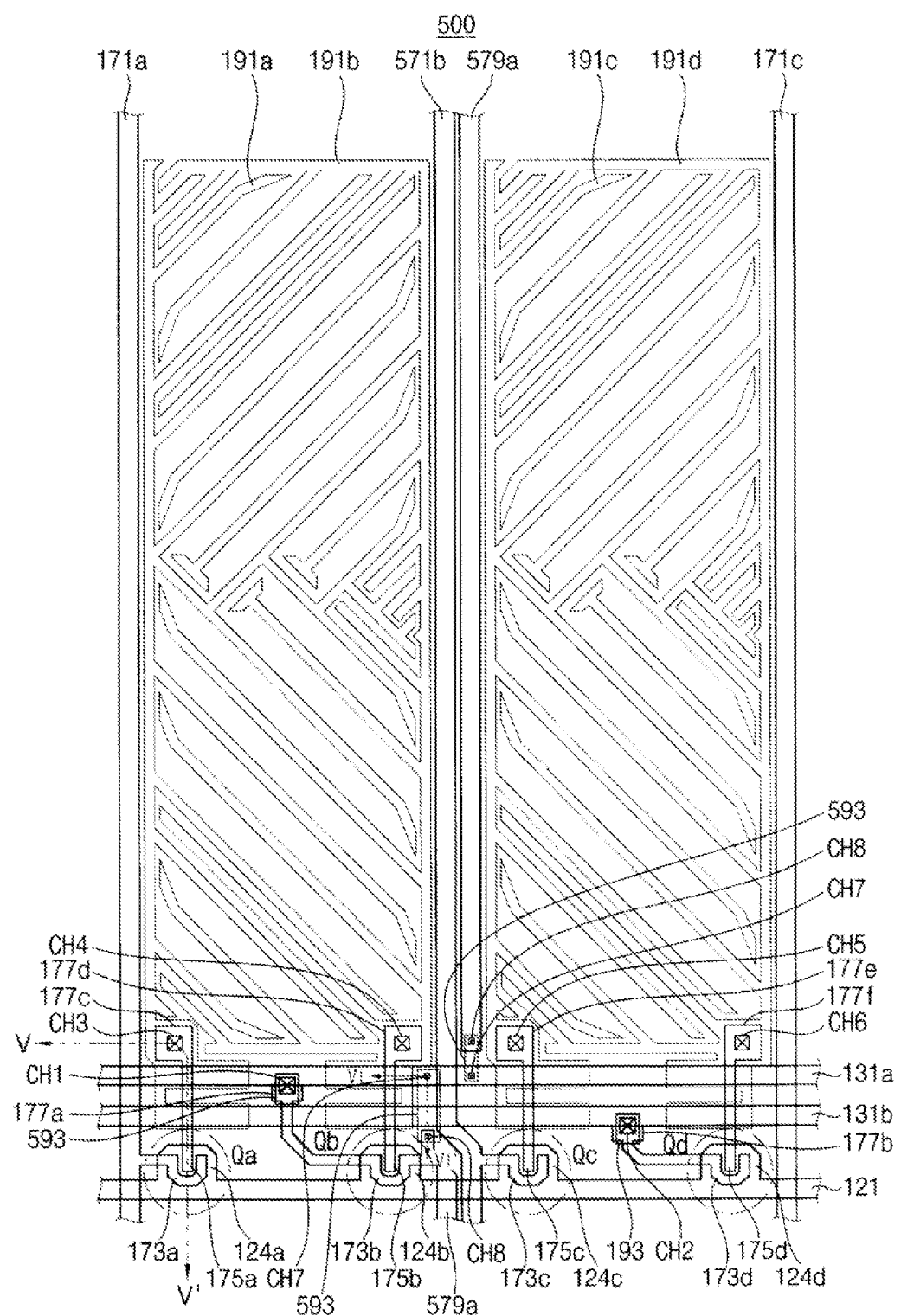
FIG. 13 is a plan view illustrating a display panel according to Example Embodiment 3 of the present invention.

FIG. 13 is a plan view illustrating a display panel according to Example Embodiment 3 of the present invention.

A cross-sectional view taken along a line V-V' in FIG. 13 is substantially the same as the cross-sectional view of FIG. 4. Thus, the cross-sectional view taken along the line V-V' in FIG. 13 will be omitted. Additionally, a cross-sectional view taken along a line VI-VI' in FIG. 13 is substantially the same as the cross-sectional view of FIG. 5 except that the third power line 131b is disposed between the first power line 131a and a second power line 579a. Thus, the same reference numerals will be used to designate the same elements, and any redundant explanation will be omitted.

The second power line 579a of a display substrate 500 according to the present embodiment is alternately disposed at a left side of the second data line 571b or at a right side of the second data line 571b with respect to the second data line 571b corresponding to pixels adjacent in the second direction DI2.

Accordingly, a first transparent electrode 593 connecting the second power line 579a and the first power line 131a is used for both of the first pixel area PX(n,n) and the second pixel area PX(n,n+1). In this case, the first transparent electrode 593 in the first pixel area PX(n,n) and the first transparent electrode 593 in the second pixel area PX(n,n+1) are spaced apart from each other.

A method of manufacturing the display substrate according to the present example embodiment is substantially the same as the method according to Example Embodiment 1 and Example Embodiment 2 except that the second power line 579a is alternately disposed at a left side of the second data line 571b or at a right side of the second data line 571b with respect to the second data line 571b corresponding to pixels adjacent in the direction DI2 of the data line. Thus, the same reference numerals will be used to designate the same elements, and any redundant explanation will be omitted.

Figure 14:
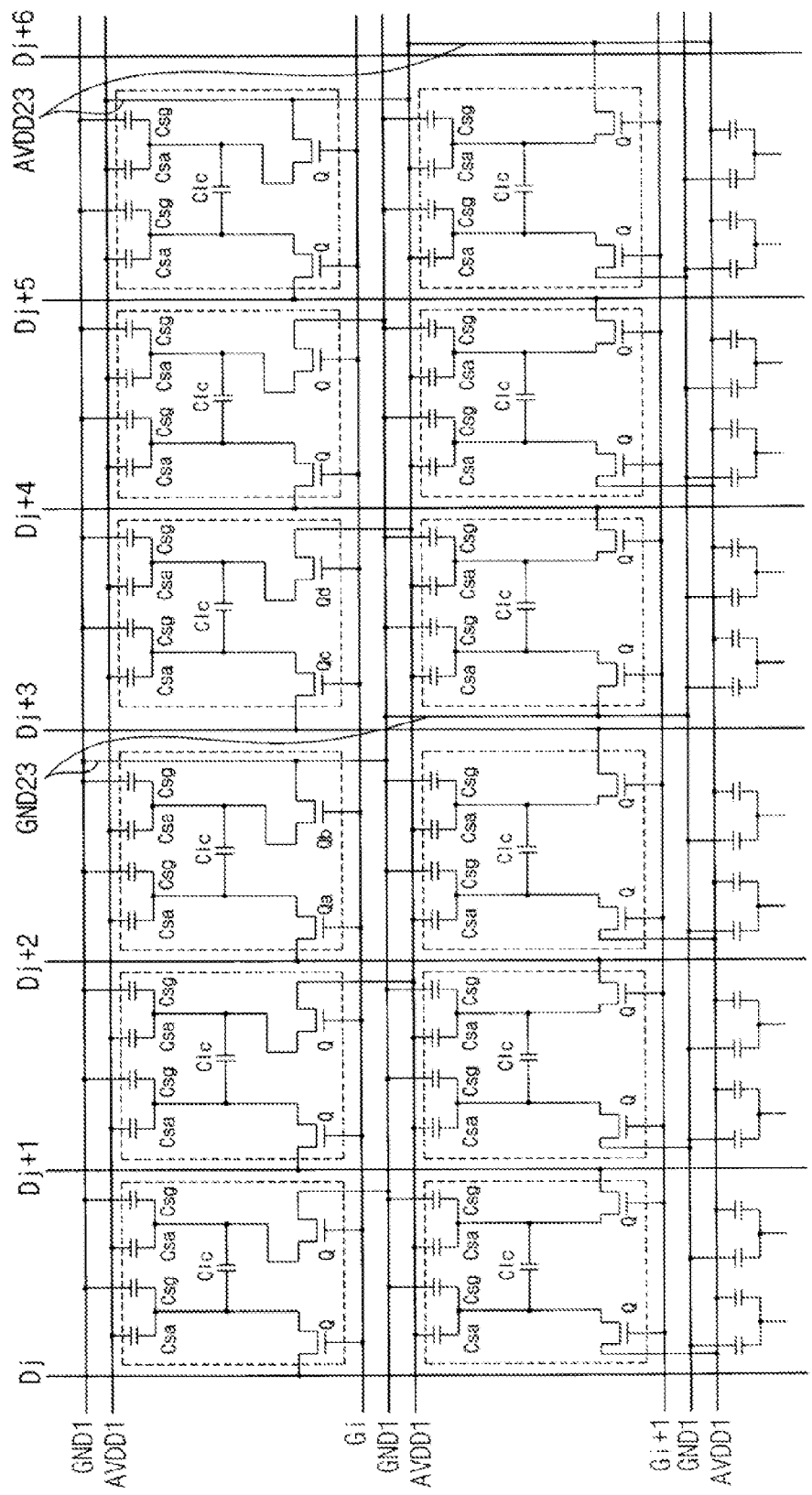
FIG. 14 is an equivalent circuit diagram illustrating the display panel shown in FIG. 13.

FIG. 14 is an equivalent circuit diagram illustrating the display panel shown in FIG. 13.

A waveform diagram illustrating voltages applied to the equivalent circuit shown in FIG. 14 is substantially the same as the waveform diagram of FIG. 8. Thus, the waveform diagram according to the present embodiment will be omitted.

Referring to FIGS. 13 and 14, the second power line 579a represents a second ground line GND23. Although not shown, the fourth power line explained in Example Embodiment 1 represents a second power supply line AVDD23.

In this case, the second ground line GND23 is connected to the first ground line GND1 through the first transparent electrode 593 at a left side of the (j+3)-th data line Dj+3, in correspondence with the i-th gate line Gi. The second ground line GND23 is connected to the first ground line GND1 through the first transparent electrode 593 at a right side of the (j+3)-th data line Dj+3, in correspondence with the (i+1)-th gate line Gi+1.

In the present embodiment, the second power line 579a is alternately disposed at a left side of the second data line 571b or at a right side of the second data line 571b with respect to the second data line 571b corresponding to pixels that are adjacent in the second direction DI2. Thus, a dot inversion may be implemented per a frame.

Example Embodiment 4

Figure 15:
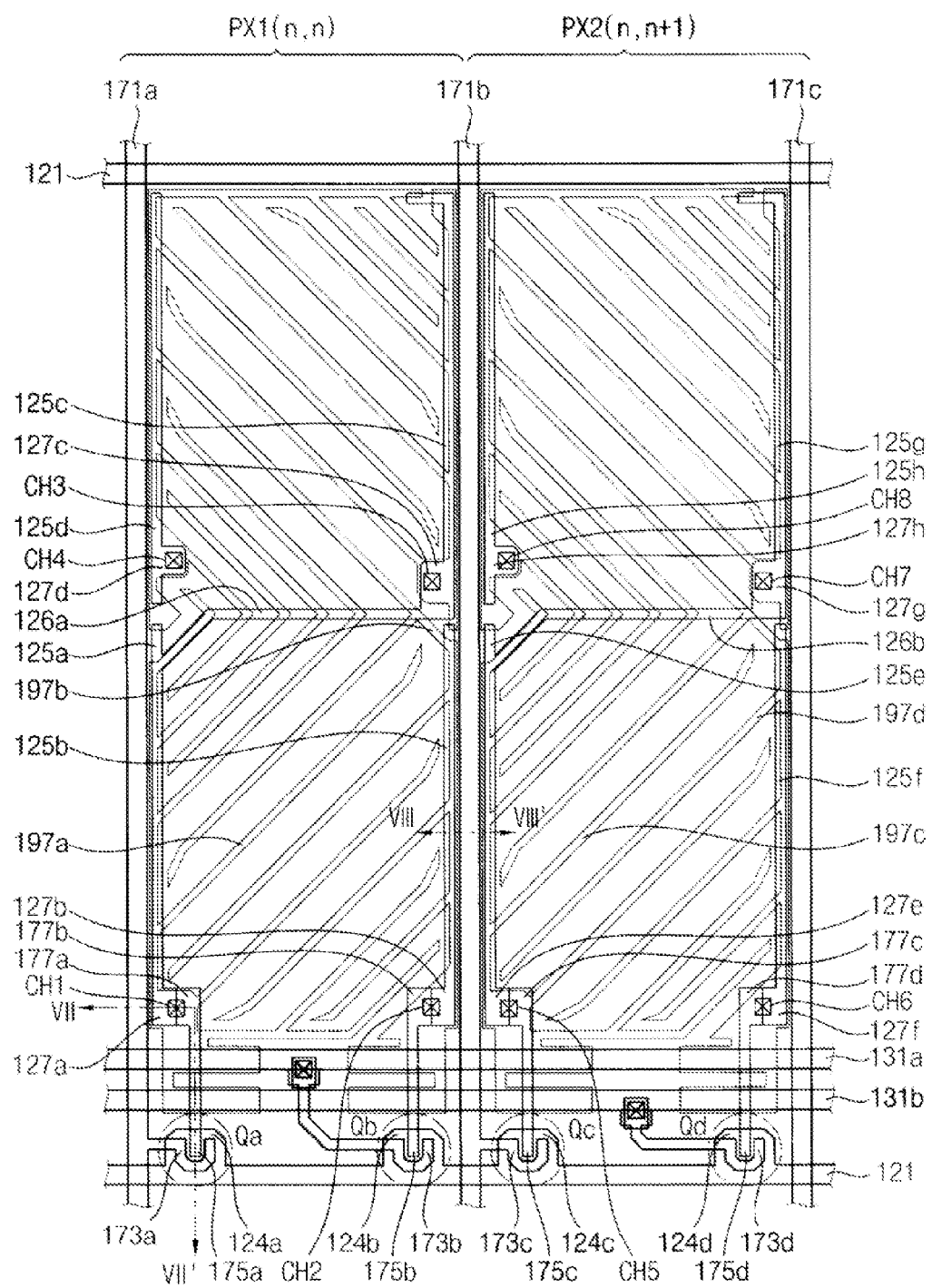
FIG. 15 is a plan view illustrating a display panel according to Example Embodiment 4 of the present invention.
Figure 16:
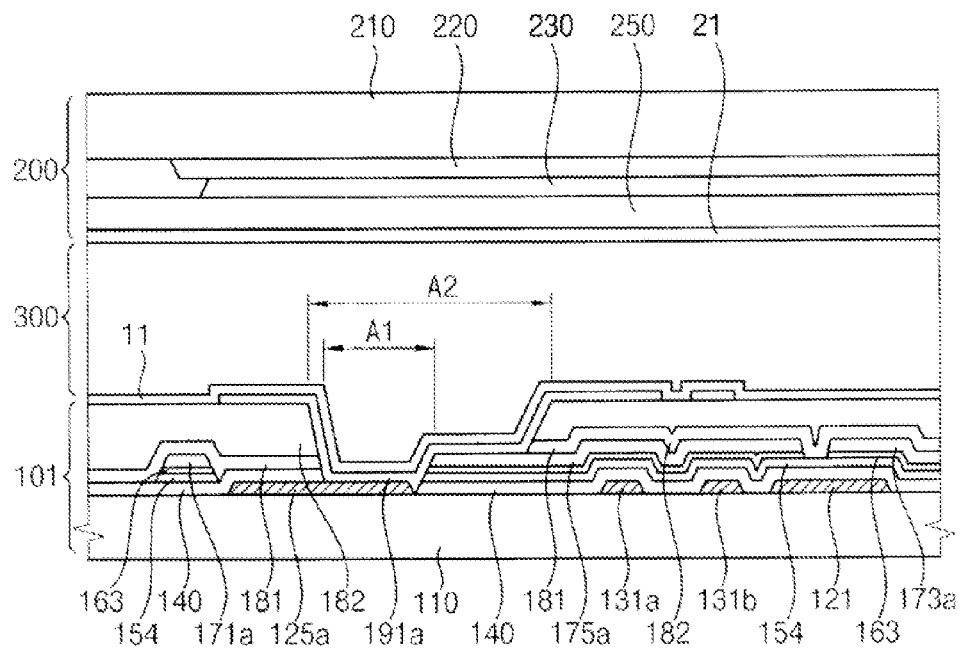
FIG. 16 is a cross-sectional view taken along a line VII-VII' in FIG. 15.
Figure 17:
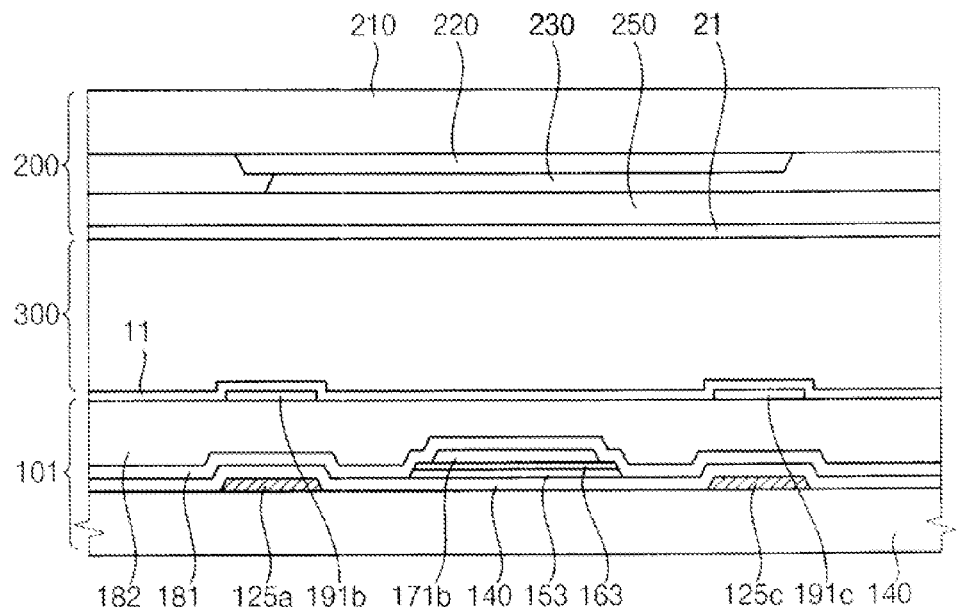
FIG. 17 is a cross-sectional view taken along a line VIII-VIII' in FIG. 15.

FIG. 15 is a plan view illustrating a display panel according to Example Embodiment 4 of the present invention. FIG. 16 is a cross-sectional view taken along a line VII-VII' in FIG. 15. FIG. 17 is a cross-sectional view taken along a line VIII-VIII' in FIG. 15.

Referring to FIGS. 15 through 17, the display panel according to the present example embodiment includes a display substrate 101, an opposite substrate 200 and a liquid crystal layer 300.

The display panel according to the present embodiment is substantially the same as the display panel according to Example Embodiment 1 except that the display substrate 101 further includes first to eighth shield patterns 125a to 125h and shapes of first to fourth pixel electrodes 197a to 197d are different from the first to fourth pixel electrodes 191a to 191d. Thus, the same reference numerals will be used to designate the same elements, and any redundant explanation will be omitted.

In addition, a second power line 131b of the present embodiment corresponds to the third power line 131b in the Example Embodiment 1 of the present invention.

The display substrate 101 includes a first base substrate 110. A plurality of pixel regions P is defined in the first base substrate 110. In FIG. 15, a first pixel area PX1(n,n) and a second pixel area PX2(n,n+1) of the display panel are illustrated. A gate metal layer is formed on the first base substrate 110. The gate metal layer may include a gate line 121, a first power line 131a, a second power line 131b, a first shield pattern 125a, a second shield pattern 125b, a third shield pattern 125c, a fourth shield pattern 125d, a fifth shield pattern 125e, a sixth shield pattern 125f, a seventh shield pattern 125g, and an eighth shield pattern 125h.

The first to eighth shield patterns 125a to 125h extend in the second direction DI2 at longitudinal edges of the pixel areas.

A gate insulation layer 140 is formed on the first base substrate 110 to cover the gate line 121, the first and second power lines 131a and 131b, the first to eighth shield patterns 125a to 125h, and the first, second, third and fourth gate electrodes 124a, 124b, 124c and 124d.

A semiconductor layer 154 is formed on the gate insulation layer 140. The semiconductor layer 154 is formed on the first, second, third and fourth gate electrodes 124a, 124b, 124c and 124d.

An ohmic contact layer 163 is formed on the semiconductor layer 154. A data metal layer is formed on the first base substrate 110 including the ohmic contact layer 163. The data metal layer includes a first data line 171a, a second data line 171b, a third data line 171c, a first source electrode 173a, a second source electrode 173b, a third source electrode 173c, a fourth source electrode 173d, a first drain electrode 175a, a second drain electrode 175b, a third drain electrode 175c and a fourth drain electrode 175d.

The first to eighth shield patterns 125a to 125h are formed to extend parallel to the first to third data lines 171a to 171c.

A first drain contact electrode 177a expanding from the first drain electrode 175a and a first shield contact electrode 127a expanding from the first shield pattern 125a are respectively connected to a first pixel electrode 197a through a first contact hole CH1.

In the present embodiment, the first drain contact electrode 177a and the first shield contact electrode 127a are spaced apart from each other, so that the first pixel electrode 197a electrically connects the first drain contact electrode 177a and the first shield contact electrode 127a. Alternately, the first drain contact electrode 177a makes contact with the first shield contact electrode 127a.

The first shield pattern 125a extends from the first shield contact electrode 127a to a center line of the first pixel area PX1(n,n). As used herein, a "center line" extends substantially in the first direction DI1 between middle portions of adjacent data lines (in this particular case, data lines 171a, 171b).

A connection pattern 126a connects the first shield pattern 125a and the third shield pattern 125c at the center line. In this case, the connection pattern 126a crosses the first pixel area PX1(n,n) in the first direction DI1, so that the first shield pattern 125a and the third shield pattern 125c are connected to each other.

A third shield contact electrode 127c, which extends from the third shield pattern 125c close to the second data line 171b at an upper portion of the first pixel area PX1(n,n), is electrically connected to the first pixel electrode 197a through a third contact hole CH3. Thus, electrode bars of the first pixel electrode 197a spaced apart from each other may be electrically connected through the third shield pattern 125c through the third contact hole CH3. The third shield pattern 125c adjacent to the second data line 171b extends along the second data line 171b when viewed from a plan view.

A second drain contact electrode 177b expanding from the second drain electrode 175b and a second shield contact electrode 127b expanding from the second shield pattern 125b are connected to a second pixel electrode 197b through a second contact hole CH2.

In the present embodiment, the second drain contact electrode 177b and the second shield contact electrode 127b are spaced apart from each other, and the second pixel electrode 197b electrically connects the second drain contact electrode 177b and the second shield contact electrode 127b. In other embodiments, the second drain contact electrode 177b may make contact with the second shield contact electrode 127b.

The second shield pattern 125b extends from the second shield contact electrode 127b to a center line of the first pixel area PX1(n,n) along the second data line 171b.

Moreover, a fourth shield contact electrode 127d extends along the first data line 171a at the upper portion of the first pixel area PX1(n,n). In this case, the fourth shield pattern 125d is electrically connected to the second pixel electrode 197b through a fourth contact hole CH4.

A third drain contact electrode 177c expanding from the third drain electrode 175c and a fifth shield contact electrode 127e expanding from the fifth shield pattern 125e are respectively connected to a third pixel electrode 197c through a fifth contact hole CH5.

In the present embodiment, the third drain contact electrode 177c and the fifth shield contact electrode 127e are spaced apart from each other, so that the third pixel electrode 197c electrically connects the third drain contact electrode 177c and the fifth shield contact electrode 127e. In other embodiments, the third drain contact electrode 177c and the fifth shield contact electrode 127e may contact each other.

The fifth shield pattern 125e extends from the fifth shield contact electrode 127e to the center line of the second pixel area PX2(n,n+1), parallel to the second data line 171b.

A connection pattern 126b connecting the fifth shield pattern 125e and the seventh shield pattern 125g may be further formed at the center line. In this case, the connection pattern 126b extends in a horizontal direction of the second pixel area PX2(n,n+1), so that the fifth shield pattern 125e and the seventh shield pattern 125g are connected to each other.

The third data line 171c is electrically connected to the third pixel electrode 197c through a seventh contact hole CH7 at an upper portion of the first pixel area PX2(n,n+1). Thus, electrode bars of the third pixel electrode 197c separated with each other may be electrically connected through the seventh shield pattern 125g and the seventh contact hole CH7. The seventh shield pattern 125g close to the third data line 171c extends upward along the third data line 171c.

A fourth drain contact electrode 177d extending from the fourth drain electrode 175d and a sixth shield contact electrode 127f extending from the sixth shield pattern 125f are connected to a fourth pixel electrode 197d through a sixth contact hole CH6.

In the present embodiment, the fourth drain contact electrode 177d and the sixth shield contact electrode 127f are spaced apart from each other, and the fourth pixel electrode 197d electrically connects the fourth drain contact electrode 177d and the sixth shield contact electrode 127f. In other embodiments, the fourth drain contact electrode 177d and the sixth shield contact electrode 127f may contact each other.

The sixth shield pattern 125f extends from the sixth shield contact electrode 127f to the center line of the second pixel area PX2(n,n+1) along the third data line 171c.

In addition, the eighth shield pattern 125h extends along the second data line 171b at the upper portion of the first pixel area PX2(n,n+1). In this case, the eighth shield pattern 125h is electrically connected to the fourth pixel electrode 197d through an eighth contact hole CH8.

A data insulation layer 180 is formed on the gate insulation layer 140 to cover the first, second and third data lines 171a, 171b and 171c, the first, second, third and fourth source electrodes 173a, 173b, 173c and 173d, and the first, second, third and fourth drain electrodes 175a, 175b, 175c and 175d.

The first contact hole CH1 is formed through the gate insulation layer 140 and the data insulation layer 180, so that the first drain contact electrode 177a and the first shield contact electrode 127a are exposed. At this time, a first area A1 of the gate insulation layer 140 is etched, so that the first drain contact electrode 177a is exposed. In this case, the gate insulation layer 140 and the data insulation layer 180 may be etched at once. Thus, the first drain contact electrode 177a and the first shield contact electrode 127a, which do not overlap each other, may be connected to the first pixel electrode 197a.

Similarly, the second contact hole CH2 is formed through the gate insulation layer 140 and the data insulation layer 180, so that the second drain contact electrode 177b and the second shield contact electrode 127b are exposed. The fifth contact hole CH5 is formed through the gate insulation layer 140 and the data insulation layer 180, so that the third drain contact electrode 177c and the fifth shield contact electrode 127e are exposed. The sixth contact hole CH6 is formed through the gate insulation layer 140 and the data insulation layer 180, so that the fourth drain contact electrode 177d and the sixth shield contact electrode 127f are exposed.

The third contact hole CH3, the fourth contact hole CH4, the seventh contact hole CH7 and the eighth contact hole CH8 are formed through the insulation layer 180, so that the third shield pattern 125c, the fourth shield pattern 125d, the seventh shield pattern 125g and the eighth shield pattern 125h are exposed, respectively.

The first to fourth pixel electrodes 197a to 197d are formed on the data insulation layer 180 by using a transparent conductive material including indium tin oxide (ITO), indium zinc oxide (IZO), etc.

For example, the first pixel electrode 197a is connected to the first drain contact electrode 177a and the first shield contact electrode 127a through the first contact hole CH1 and extends to the center line of the first pixel area PX1(n,n) to overlap the first shield pattern 125a. The first pixel electrode 197a extends at an angle of about 45 degrees with respect to the gate line 121 on one side of the center line and extends at an angle of about 135 degrees with respect to the gate line 121 on the other side of the center line.

In addition, the first pixel electrode 197a is electrically connected to the third shield pattern 125c through the third contact hole CH3 above the center line, extends upward to overlap with the third shield pattern 125c close to the second data line 171b, and extends at an angle of about 135 degrees with respect to the gate line 121 above the center line.

The second pixel electrode 197b is connected to the second drain contact electrode 177b and the second shield contact electrode 127b through the second contact hole CH2 and extends to the center line of the first pixel area PX1(n,n) to overlap the second shield pattern 125b. The second pixel electrode 197b extends at an angle of about 135 degrees with respect to the gate line 121 on one side of the center line and extends at an angle of about 225 degrees with respect to the gate line 121 on the other side of the center line.

In addition, the second pixel electrode 197b is electrically connected to the fourth shield pattern 125d through the fourth contact hole CH4 above the center line, and extends upward to overlap with the fourth shield pattern 125d close to the first data line 171a. The second pixel electrode 197b extends at an angle of about 135 degrees with respect to the gate line 121 above the center line and at an angle of about 225 degrees with respect to the gate line 121 below the center line.

In the present embodiment, an edge portion of the first shield pattern 125a corresponding to a far area from the first data line 171a fully overlapping an edge portion of the first pixel electrode 197a corresponding to a far area from the first data line 171a, and an edge portion of the second shield pattern 125b corresponding to a far area from the second data line 171b fully overlapping an edge portion of the second pixel electrode 197b corresponding to a far area from the second data line 171b.

The third pixel electrode 197c is connected to the third drain contact electrode 177c and the fifth shield contact electrode 127e through the fifth contact hole CH5 and extends to the center line of the second pixel area PX2(n,n+1) to overlap the fifth shield pattern 125e. The third pixel electrode 197c extends at an angle of about 45 degrees with respect to the gate line 121 below the center line and at an angle of about 135 degrees with respect to the gate line 121 above the center line.

In addition, the third pixel electrode 197c is electrically connected to the seventh shield pattern 125g through the seventh contact hole CH7 above the center line. The third pixel electrode 197c extends upward to overlap with the seventh shield pattern 125g close to the third data line 171c, and extends at an angle of about 135 degrees with respect to the gate line 121 above the center line.

The fourth pixel electrode 197d is connected to the fourth drain contact electrode 177d and the sixth shield contact electrode 127f through the sixth contact hole CH6 and extends to the center line of the second pixel area PX2(n,n+1) to overlap the sixth shield pattern 125f. The fourth pixel electrode 197d extends at an angle of about 135 degrees with respect to the gate line 121 on one side of center line and at an angle of about 225 degrees with respect to the gate line 121 on the other side of the center line.

In addition, the fourth pixel electrode 197d is electrically connected to the eighth shield pattern 125h through the eighth contact hole CH8 above the center line, and extends to overlap with the eighth shield pattern 125h close to the second data line 171b. The fourth pixel electrode 197d extends at an angle of about 135 degrees with respect to the gate line 121 on one side of the center line and extends at an angle of about 225 degrees with respect to the gate line 121 on the other side of the center line.

The lower alignment layer 11 is formed on the first base substrate 110 including the first to fourth pixel electrodes 197a to 197d to align liquid crystal molecules of the liquid crystal layer 300 in a vertical direction. Thus, the liquid crystal molecules of the liquid crystal layer 300 are aligned from the display substrate 101 toward the opposite substrate 200.

The opposite substrate 200 faces the display substrate 101. The opposite substrate 200 includes a second base substrate 210, a light-blocking pattern 220, a color filter pattern 230, an overcoating layer 250 and an upper alignment layer 21.

The liquid crystal layer 300 is interposed between the display substrate 101 and the opposite substrate 200.

Figure 18A:
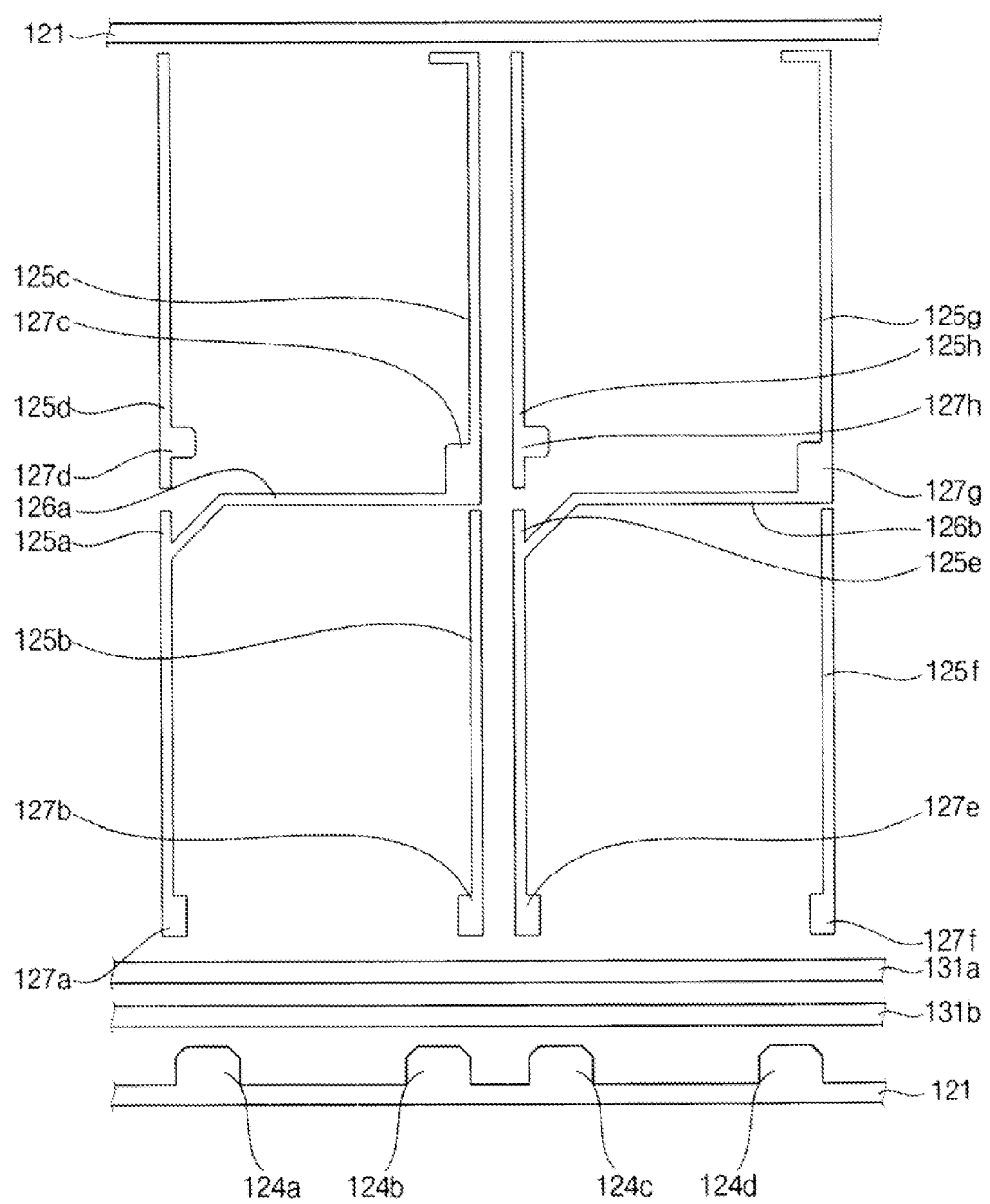
FIGS. 18A through 18C are plan views illustrating a method of manufacturing a display substrate of FIG. 15.
Figure 18B:
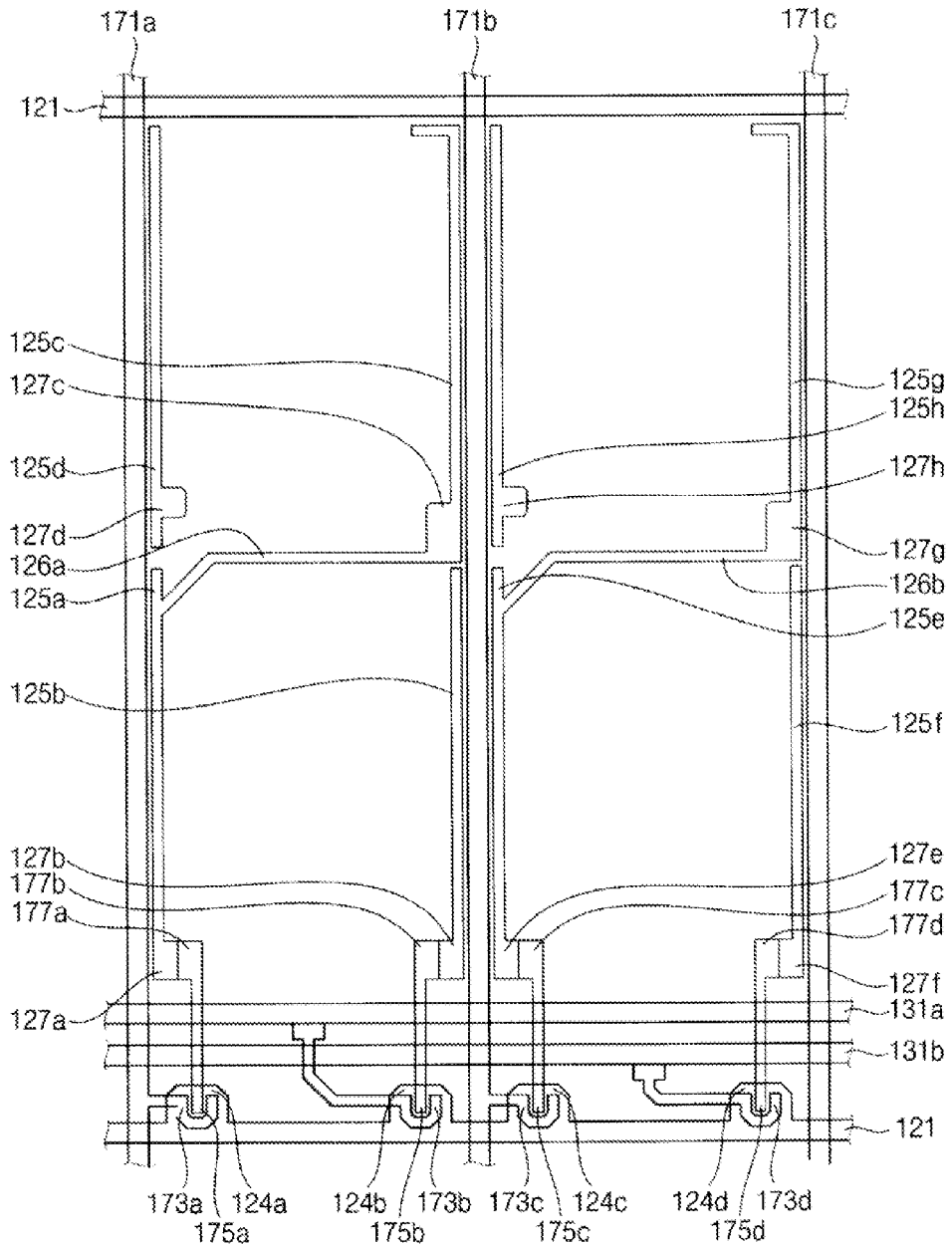
Figure 18C:
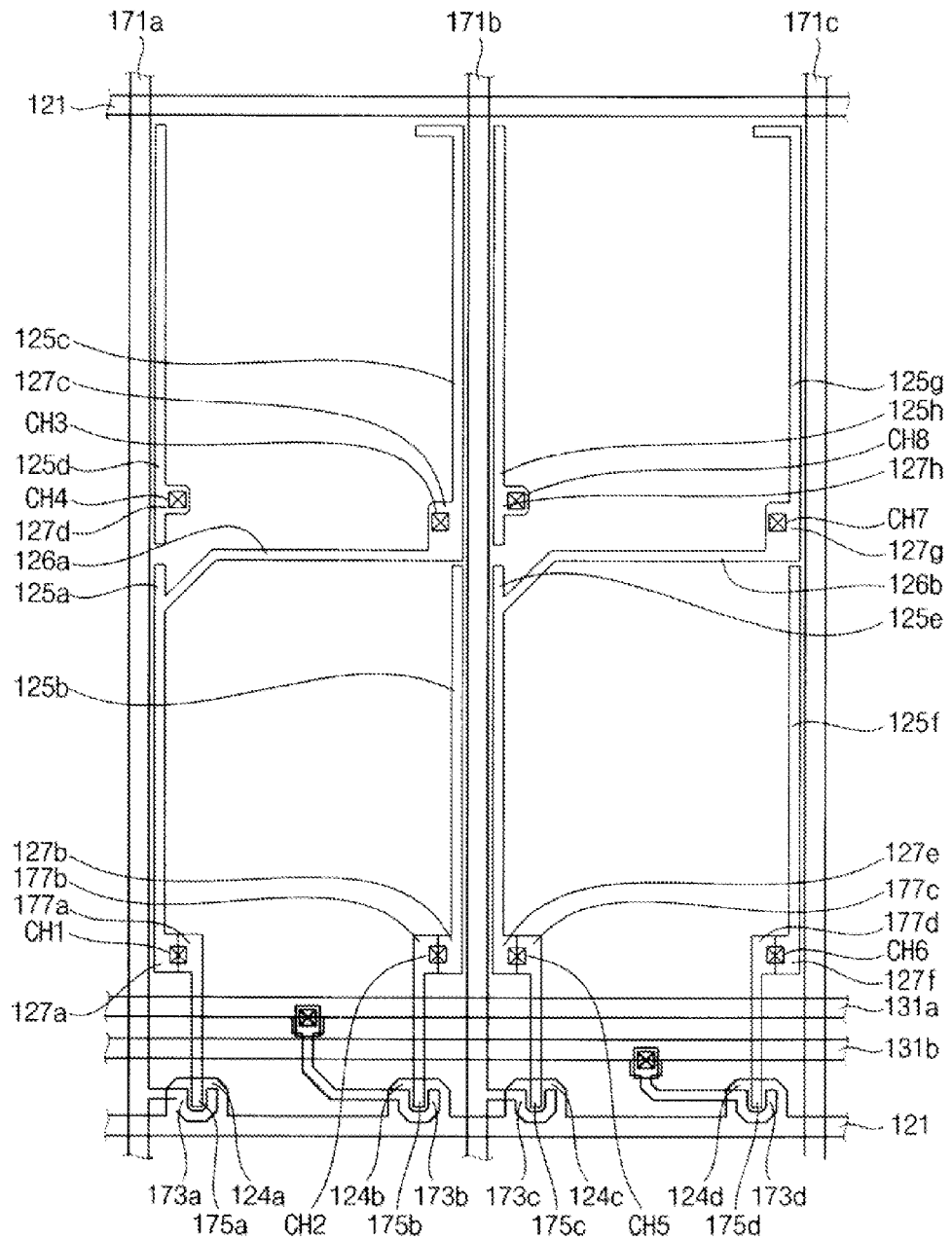

FIGS. 18A through 18C are plan views illustrating a method of manufacturing a display substrate of FIG. 15.

Figure 19A:
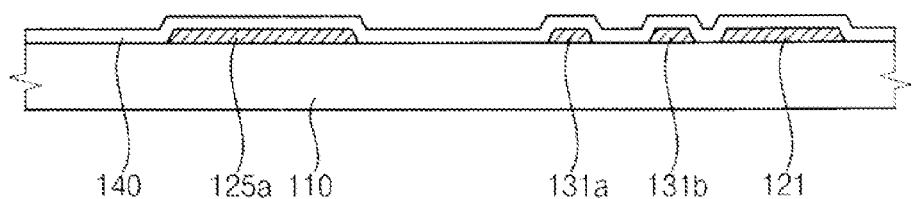
FIGS. 19A through 19C are cross-sectional views respectively corresponding to the FIGS. 18A through 18C to illustrate a method of manufacturing a display substrate of FIG. 15.
Figure 19B:
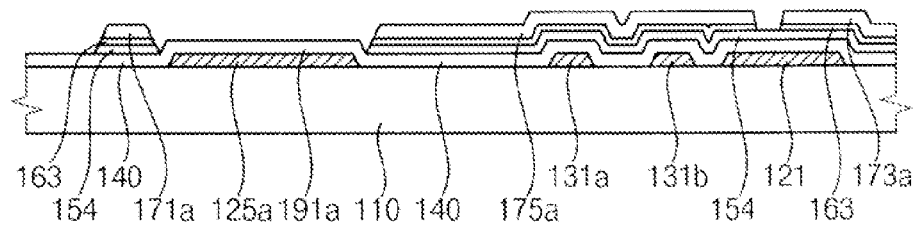
Figure 19C:
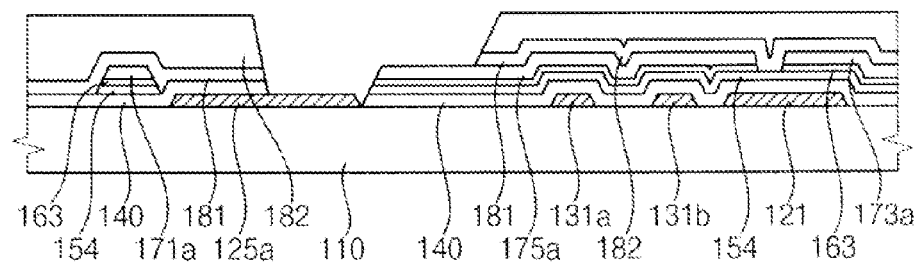

FIGS. 19A through 19C are cross-sectional views respectively corresponding to the FIGS. 18A through 18C to illustrate a method of manufacturing the display substrate of FIG. 15.

Referring to FIGS. 15, 18A and 19A, the gate line 121, the first to fourth gate electrodes 124a to 124d, the first power line 131a, the second power line 131b, the first to eighth shield patterns 125a to 125h, the connection patterns 126a and 126b, and the first to eighth shield contact electrodes 127a to 127h extending from the first to eighth shield patterns 125a to 125h are formed on the first base substrate 110.

In this case, the gate line 121, the first power line 131a and the second power line 131b are formed in the first direction DI1. The first to eighth shield patterns 125a to 125h are formed in the second direction DI2.

In addition, the first shield pattern 125a faces the second shield pattern 125b, and the third shield pattern 125c faces the fourth shield pattern 125d. The fifth shield pattern 125e faces the sixth shield pattern 125f, and the seventh shield pattern 125g faces the eighth shield pattern 125h. As used herein, shield patterns that "face" each other extend substantially parallel to each other and to the data lines, and are respectively positioned close to adjacent data lines (e.g., 171a and 171b) within an area defined by the adjacent data lines, a gate line 121, and a connection pattern 126a/b.

Then, the gate insulation layer 140 is formed.

Referring to FIGS. 15, 18B and 19B, an ohmic contact layer 163 and a semiconductor layer 154 are formed on the gate insulation layer 140. Then, the first data line 171a extending in the second direction DI2 close to the first and fourth shield patterns 125a and 125d, the second data line 171b extending in the second direction DI2 close to the second and third shield patterns 125b and 125c in the first pixel area PX1(n,n) and close to the fifth and eighth shield patterns 125e and 125h in the second pixel area PX2(n,n+1), and the third data line 171c extending in the second direction DI2 close to the sixth and seventh shield patterns 125f and 125g are formed.

The first to fourth source electrodes 173a to 173d and the first to fourth drain electrodes 175a to 175d of the first to fourth switching elements Qa to Qd, and the first to fourth drain contact electrodes 177a to 177d extending from the first to fourth drain electrodes 175a to 175d are also formed.

In this case, the ohmic contact layer 163 and the semiconductor layer 154 may be etched at the same time with the data metal layer.

Referring to FIGS. 15, 18C and 19C, the data insulation layer 180 is formed on the first base substrate 110 that has the etched data metal layer thereon. The first to eighth contact holes CH1 to CH8 are formed through the data insulation layer 180, so that the first to fourth pixel electrodes 197a to 197d contact the first to eighth shield patterns 125a to 125h.

At this time, the gate insulation layer 140 formed on the gate metal layer and the data insulation layer 180 formed on the data metal layer may be etched at the same time.

Referring to FIGS. 15 and 16, the first to fourth pixel electrodes 197a to 197d are formed on the first base substrate 110 that has the first to eighth contact holes CH1 to CH8 thereon.

The first pixel electrode 197a makes contact with the first shield contact electrode 127a and the first drain contact electrode 177a through the first contact hole CH1 of the data insulation layer 180. The first pixel electrode 197a also makes contact with the third shield contact electrode 127c through the third contact hole CH3 of the insulation layer 180.

The second pixel electrode 197b makes contact with the second shield contact electrode 127b and the second drain contact electrode 177b through the second contact hole CH2 of the data insulation layer 180. The second pixel electrode 197b also makes contact with the fourth shield contact electrode 127d through the fourth contact hole CH4 of the insulation layer 180.

The third pixel electrode 197c makes contact with the fifth shield contact electrode 127e and the third drain contact electrode 177c through the fifth contact hole CH5 of the data insulation layer 180. The third pixel electrode 197c also makes contact with the seventh shield contact electrode 127g through the seventh contact hole CH7 of the insulation layer 180.

The fourth pixel electrode 197d makes contact with the sixth shield contact electrode 127f and the fourth drain contact electrode 177d through the sixth contact hole CH6 of the data insulation layer 180 and makes contact with the eighth shield contact electrode 127h through the eighth contact hole CH28 of the insulation layer 180.

In this case, the first and third shield patterns 125a and 125c respectively overlap with a first end portion and a second end portion of the first pixel electrode 197a when viewed on a plan view, and the second and fourth shield patterns 125b and 125d respectively overlap with a first end portion and a second end portion of the second pixel electrode 197b when view on a plan view.

The fifth and seventh shield patterns 125e and 125g respectively cover a first end portion and a second end portion of the third pixel electrode 197c, and the sixth and eighth shield patterns 125f and 125h respectively cover a first end portion and a second end portion of the fourth pixel electrode 197d.

According to the present embodiment, a storage line is not formed on the display substrate. The first and second power lines 131a and 131b overlap with the pixel electrodes so that storage capacitors are formed. Thus, aperture ratio is increased.

In addition, according to the present invention, when the same voltage is applied to the first pixel electrode 197a and the second pixel electrode 197b in the first pixel area PX1(n, n), generation of electric field between the second data line 171b and the pixel electrodes 197a and 197b caused by the voltage difference between the second data line 171b and the first and second pixel electrodes 197a and 197b may be avoided.

In addition, according to the present invention, when the same voltage is applied to the first pixel electrode 197a and the second pixel electrode 197b in the first pixel area PX1(n, n) and a frame is changed, generation of electric field between the first data line 171a and the pixel electrodes 197a and 197b caused by a voltage difference between the first data line 171a and the first and second pixel electrodes 197a and 197b may be avoided. Thus, the electric field that is generated when the display panel is driven in the black mode may be prevented, reducing light leakage.

Similarly, according to the present invention, when the same voltage is applied to the third pixel electrode 197c and the fourth pixel electrode 197d in the second pixel area PX2 (n,n+1), generation of electric field between the third data line 171c and the pixel electrodes 197c and 197d caused by voltage difference between the third data line 171c and the third and fourth pixel electrodes 197c and 197d may be avoided.

In addition, according to the present invention, when the same voltage is applied to the third pixel electrode 197c and the fourth pixel electrode 197d in the second pixel area PX2 (n,n+1) and a frame is changed, generation of electric field between the second data line 171b and the pixel electrodes 197c and 197d that is caused by voltage difference between the second data line 171b and the third and fourth pixel electrodes 197c and 197d may be avoided. Thus, generation of electric field when the display panel is driven in the black mode may be prevented, reducing light leakage.

Figure 20:
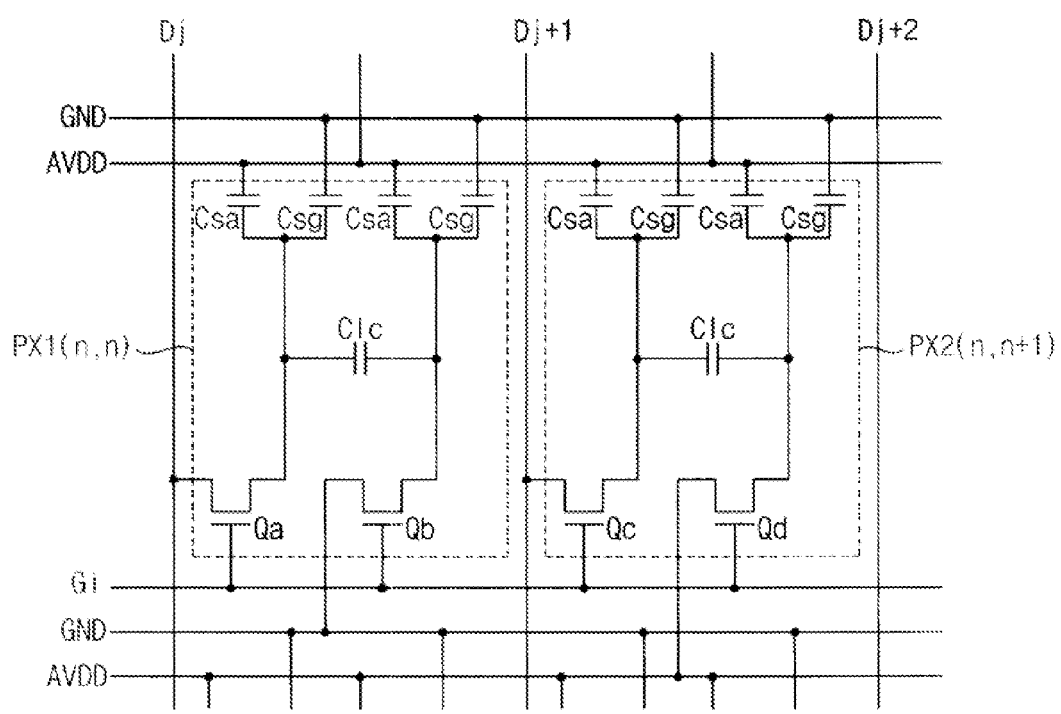
FIG. 20 is an equivalent circuit diagram illustrating a first pixel electrode and a second pixel electrode of FIG. 15.

FIG. 20 is an equivalent circuit diagram illustrating a first pixel electrode and a second pixel electrode of FIG. 15.

Referring to FIGS. 15 through 20, the display panel includes signal lines Dj, Dj+1, Dj+2, Gi and Gi+1, a ground line GND and a power supply line AVDD.

The display panel includes a plurality of pixels electrically connected to the signal lines Dj, Dj+1, Dj+2, Gi and Gi+1, a ground line GND and a power supply line AVDD. The pixels are arranged in a matrix configuration.

Referring to FIG. 16, the display panel includes the display substrate 101, the opposite substrate 200 facing the display substrate 101, and the liquid crystal layer 300 interposed between the display substrate 101 and the opposite substrate 200.

The signal lines Dj, Dj+1, Dj+2 and Gi include a first gate line Gi, a first data line Dj, a second data line Dj+1 and a third data line Dj+2. The first and second gate lines Gi and Gi+1 transmit a gate signal (a scan signal). The first, second and third data lines Dj, Dj+1 and Dj+2 transmit a data voltage.

The first gate line Gi, the ground line GND and the power supply line AVDD extend in a first direction DI1, and are substantially parallel to each other. The first, second and third data lines Dj, Dj+1 and Dj+2 extend in a second direction DI2, and are substantially parallel to each other.

The first and second data lines Dj and Dj+1 receive different voltages. The third data line Dj+2 and a fourth data line (not shown) adjacent to the third data line Dj+2 receive different voltages.

For example, in the first pixel area PX1(n,n) and the second pixel area PX2(n,n+1), the first, second and third data lines Dj, Dj+1 and Dj+2 of FIG. 20 respectively represent the first, second and third data lines 171a, 171b and 171c of FIG. 15.

The first gate line Gi of FIG. 20 represents the gate line 121. The ground line GND and the power supply line AVDD of FIG. 20 respectively represent the first power line 131a and the second power line 131b of FIG. 15.

In addition, the first and third switching elements Qa and Qc are respectively connected to the first and second data lines 171a and 171b, the second and fourth switching elements Qb and Qd are respectively connected to the first and second power lines 131a and 131b.

Referring to FIG. 20, the first and second data lines Dj and Dj+1 are respectively connected to the first and third switching elements Qa and Qc. Additionally, the ground line GND and the power supply line AVDD are respectively connected to the second and fourth switching elements Qb and Qd.

Referring to FIGS. 15 and 20 again, the first power line 131a and the second power line 131b overlap with the first and second pixel electrodes 191a and 191b electrically connected to the first and second switching elements Qa and Qb to form storage capacitors Csa and Csg, respectively. Similarly, the first power line 131a and the second power line 131b overlap with the third and fourth pixel electrodes 191c and 191d electrically connected to the third and fourth switching elements Qc and Qd to form storage capacitors Csa and Csg, respectively.

The liquid crystal layer 300 in the first and second pixel areas PX1(n,n) and PX2(n,n+1) functions as a dielectric material of the liquid crystal capacitor Clc. The liquid crystal capacitor Clc is formed by the pixel electrodes and the liquid crystal layer 300.

The liquid crystal layer 300 has dielectric anisotropy. When the electric field is not applied to the liquid crystal layer 300, the liquid crystal molecules of the liquid crystal layer 300 are vertically aligned between the display substrate 101 and the opposite substrate 200.

According to the present embodiment, a shield pattern electrically connected to a pixel electrode is formed close to adjacent data lines to overlap the pixel electrode. Thus, generation of electric field when the display panel is driven in the black mode may be prevented, reducing light leakage.

Example Embodiment 5

Figure 21:
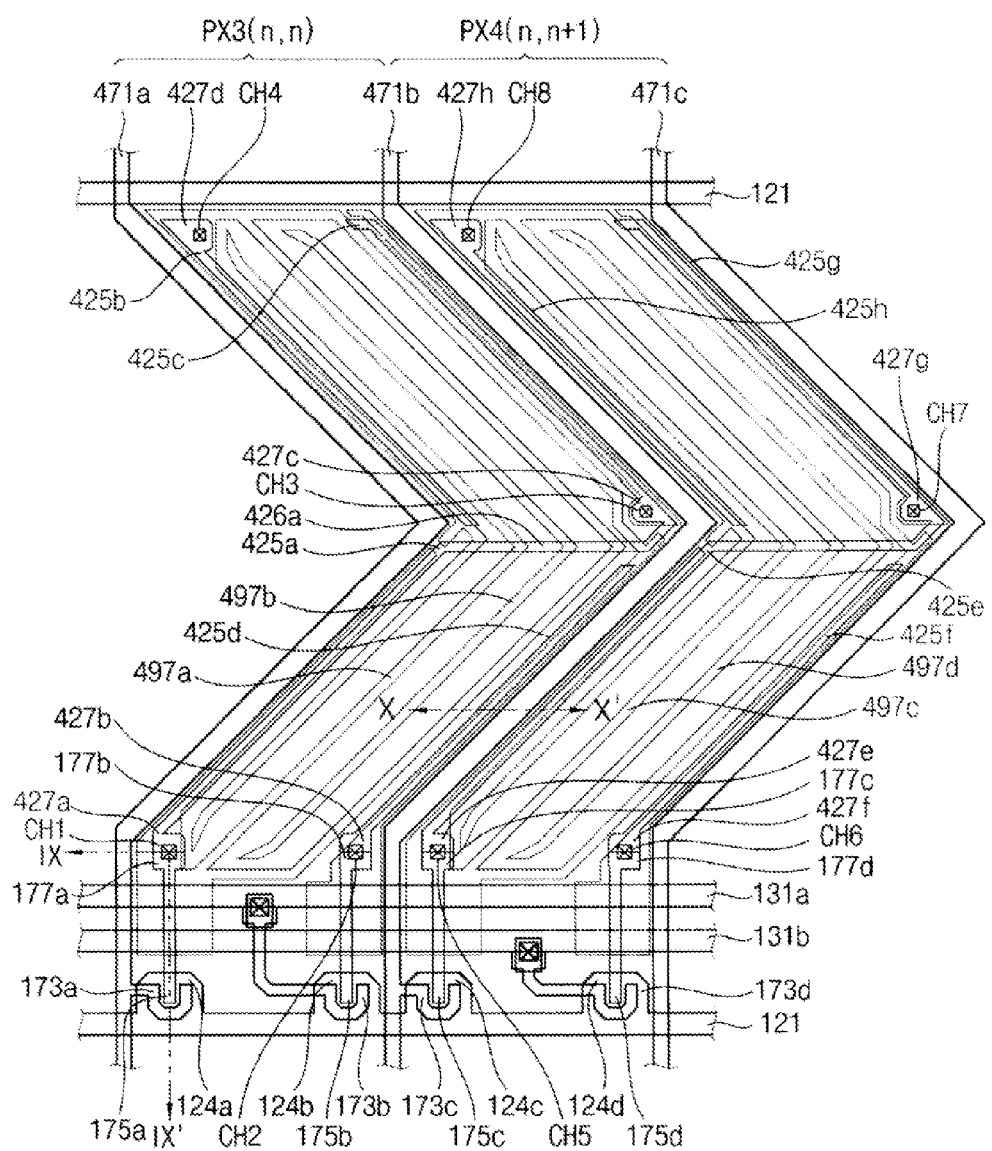
FIG. 21 is a plan view illustrating a display panel according to Example Embodiment 5 of the present invention.

FIG. 21 is a plan view illustrating a display panel according to Example Embodiment 5 of the present invention.

A cross-sectional view taken along a line IX-IX' and a cross-sectional view taken along a line X-X' in FIG. 21 are substantially the same as the cross-sectional views of FIGS. 16 and 17. Thus, the cross-sectional view taken along the line IX-IX' and the cross-sectional view taken along the line X-X' in FIG. 21 will be omitted.

The display panel according to the present embodiment is substantially the same as the display panel according to Example Embodiment 4 except that a third pixel area PX3(n,n) and a fourth pixel area PX4(n,n+1) have non-rectangular (e.g., chevron) shapes. Thus, the same reference numerals will be used to designate the same elements, and any redundant explanation will be omitted.

Referring to FIGS. 15 through 17, and 21, a display substrate 400 according to the present embodiment has fourth to sixth data lines 471a to 471c having bent shapes (e.g., chevron shape) instead of the first to third data lines 171a to 171d and the first to eighth shield patterns 125a to 125h having long straight portions as in Example Embodiment 4. The fourth to sixth data lines 471a to 471c extend in varying diagonal directions, changing directions as they extend between two adjacent gate lines 121.

In addition, the display substrate 400 according to the present embodiment includes first to fourth pixel electrodes 497a to 497d parallel to the fourth to sixth data lines 471a to 471c instead of the first to fourth pixel electrodes 197a to 197d of Example Embodiment 4.

For example, the first and third pixel electrodes 497a and 497c connected to the first and third switching elements Qa and Qc extend substantially parallel to the fourth to sixth data lines 471a to 471c. In this case, the first and third pixel electrodes 497a and 497c extend in the first direction DI1 at first portions of the third pixel area PX3(n,n) and the fourth pixel area PX4(n,n+1), and the first and third pixel electrodes 497a and 497c have branches extending diagonally therefrom in plan view (as shown in FIG. 21).

The second and fourth pixel electrodes 497b and 497d connected to the second and fourth switching elements Qb and Qd extend substantially parallel to the fourth to sixth data lines 471a to 471c. The second and fourth pixel electrodes 497b and 497d extend in the first direction DI1 at second portions of the third pixel area PX3(n,n) and the fourth pixel area PX4(n,n+1), so that the first and third pixel electrodes 497a and 497c have branches extending diagonally therefrom in plan view.

In this case, the first pixel electrode 497a is formed close to the fourth data line 471a and the second pixel electrode 497b is formed close to the fifth data line 471b on one side of a center line of the third pixel area PX3(n,n). However, the second pixel electrode 497b is formed close to the fourth data line 471a and the first pixel electrode 497a is formed close to the fifth data line 471b on the other side of the center line of the third pixel area PX3(n,n).

Similarly, the third pixel electrode 497c is formed close to the fifth data line 471b and the fourth pixel electrode 497d is formed close to the sixth data line 471c on one side of a center line of the fourth pixel area PX4(n,n+1). However, the fourth pixel electrode 497d is formed close to the fifth data line 471b and the third pixel electrode 497c is formed close to the sixth data line 471c on the other side of the center line of the fourth pixel area PX4(n,n+1).

First to eighth shield contact electrodes 427a to 427h according to the present example embodiment are substantially the same as the first to eighth shield contact electrodes 127a to 127h according Example Embodiment 4 except that the first to eighth shield contact electrodes 427a to 427h have different shapes (e.g., chevron shapes) from those of Example Embodiment 4. Thus, the same reference numerals will be used to designate the same elements, and any redundant explanation will be omitted.

A method of manufacturing the display substrate according to the present embodiment is substantially the same as the method according to Example Embodiment 4 except that except that a third pixel area PX3(n,n) and a fourth pixel area PX4(n,n+1) have bent shapes, such as chevron shapes. Thus, the same reference numerals will be used to designate the same elements, and any redundant explanation will be omitted.

According to the present embodiment, the pixel areas P including the third pixel area PX3(n,n) and the fourth pixel area PX4(n,n+1) have chevron shapes and are arranged in a matrix configuration within the chevron shape. Thus, light transmittance may be improved.

Example Embodiment 6

Figure 22:
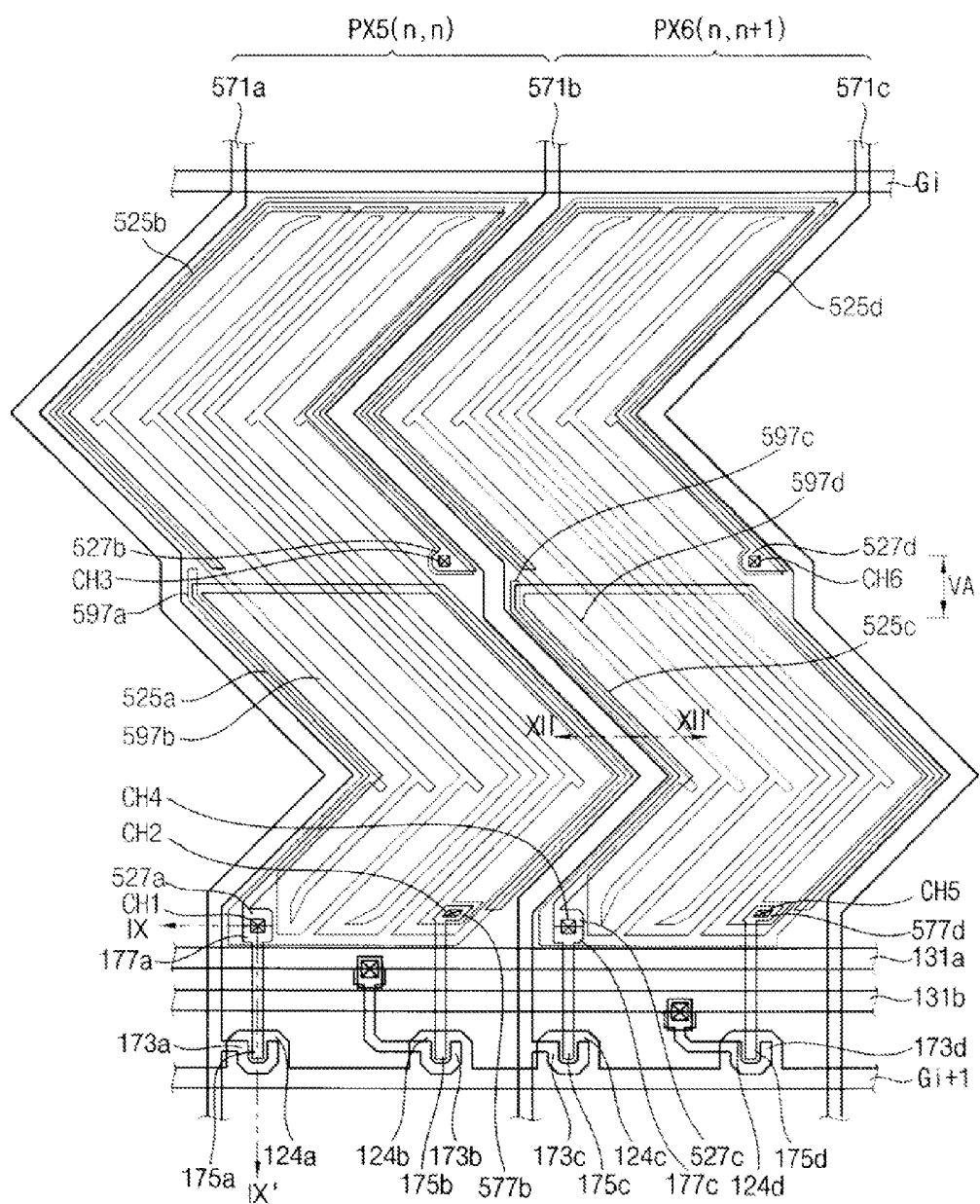
FIG. 22 is a plan view illustrating a display panel according to Example Embodiment 6 of the present invention.

FIG. 22 is a plan view illustrating a display panel according to Example Embodiment 6 of the present invention.

A cross-sectional view taken along a line XI-XI' and a cross-sectional view taken along a line XII-XII' in FIG. 22 are substantially the same as the cross-sectional views of FIGS. 16 and 17. Thus, the cross-sectional view taken along the line XI-XI' and the cross-sectional view taken along the line XII-XII' in FIG. 22 will be omitted.

The display panel according to the present embodiment is substantially the same as the display panel according to Example Embodiment 4 except that a fifth pixel area PX5(n, n) and a sixth pixel area PX6(n,n+1) generally have asymmetric double-chevron shapes. An "asymmetric double-chevron shape" is intended to refer to a shape that includes two chevrons joined such that their vertexes point in opposite directions, such as the shape illustrated in FIG. 22. Specifically, looking at the fifth pixel area PX5(n,n) in FIG. 22, it is made of one chevron "pointing" to the left (i.e., the upper half, in reference to FIG. 22) and another chevron "pointing" to the right (i.e., the lower half, in reference to FIG. 22) that are joined right along the center line. The same reference numerals will be used to designate the same elements, and any redundant explanation will be omitted.

Referring to FIGS. 15 through 17 and 22, a display substrate 500 according to the present embodiment has seventh to ninth data lines 571a to 571c and first to fourth shield patterns 525a to 525d having chevron shapes instead of the first to third data lines 171a to 171c and the first to eighth shield patterns 125a to 125h having long straight portions as in Example Embodiment 4.

In addition, the display substrate 500 according to the present embodiment includes first to fourth pixel electrodes 597a to 597d extending substantially parallel to the seventh to ninth data lines 571a to 571c instead of the first to fourth pixel electrodes 197a to 197d of Example Embodiment 4.

The seventh and eighth data lines 571a and 571b electrically connected to the first and third switching elements Qa and Qc extend diagonally with respect to the first and second directions DI1, DI2 such that the direction of extension changes twice going from one gate line 121 (e.g., Gi) to the adjacent gate line 121 (e.g., Gi+1).

In this case, the seventh to ninth data lines 571a to 571c have vertical areas VA near the center lines of the fifth pixel area PX5(n,n) and the sixth pixel area PX6(n,n+1) where two chevrons are joined.

The first and third pixel electrodes 597a and 597c that are electrically connected to the first and third switching elements Qa and Qc extend diagonally with respect to the first and second directions DI1, DI2 such that the direction of extension changes twice going from one gate line 121 (e.g., Gi) to the adjacent gate line 121 (e.g., Gi+1).

The first and third pixel electrodes 597a and 597c extend at an angle of about 45 degrees with respect to the first direction DI1 in the area nearest the gate line Gi and Gi+1. In the middle area between those two areas, the first and third pixel electrodes 597a and 597c extend at an angle of about 135 degrees with respect to the first direction DI1.

The first and third pixel electrodes 597a and 597c extend in the first direction DI1 close to the first and third switching elements Qa and Qc at first portions of the fifth pixel area PX5(n,n) and the sixth pixel area PX6(n,n+1), so that the first and third pixel electrodes 597a and 597c have branches extending therefrom in plan view.

The second and fourth pixel electrodes 597b and 597d electrically connected to the second and fourth switching elements Qb and Qd extend diagonally with respect to the first direction DI1, DI2 such that the direction of extension changes twice going from one gate line 121 (e.g., Gi) to the adjacent gate line 121 (e.g., Gi+1).

The second and fourth pixel electrodes 597b and 597d are electrically connected to fifth and sixth drain contact electrodes 577b and 577d extending from the second and fourth drain electrodes 175b and 175d through second and fifth contact holes CH2 and CH5.

The second and fourth pixel electrodes 597b and 597d extend at an angle of about 45 degrees with respect to the first direction DI1 from the second and fourth switching elements Qa and Qd near the areas close to the gate line Gi and the gate line Gi+1, and extend at an angle of about 135 degrees with respect to the first direction DI1 in the area between those two areas.

The second and fourth pixel electrodes 597b and 597d extend in the first direction at an area near the gate line Gi of the fifth and sixth pixel areas PX5(n,n) and PX6(n,n+1), so that the second and fourth pixel electrodes 597b and 597d have branches extending downward therefrom in plan view.

The first and third pixel electrodes 597a and 597c do not have long vertical portions that correspond to the vertical area VA of the fifth and sixth pixel areas PX5(n,n) and PX6(n,n+1). Thus, distances between the seventh data line 571a and the closest portion of the first pixel electrode 597a are different above the vertical area VA and below the vertical area VA. Additionally, distances between the eighth data line 571b and the closest portion of the third pixel electrode 597c are different above the vertical area VA and below the vertical area VA. Similarly, distances between the seventh data line 571a and the closest portion of the second pixel electrode 597b are different above the vertical area VA and below the vertical area VA. Additionally, distances between the eighth data line 571b and the closest portion of the fourth pixel electrode 597d are different above the vertical area VA and below the vertical area VA.

For example, the first pixel electrode 597a close to the seventh data line 571a and the third pixel electrode 597c close to the eighth data line 571b below the vertical area VA may not extend above the vertical area VA.

Similarly, the first pixel electrode 597a close to the eighth data line 571b and the third pixel electrode 597c close to the ninth data line 571c below the vertical area VA extend above the vertical area VA to be separated from the eighth data line 571b and the ninth data line 571c.

For example, the second and fourth pixel electrodes 597b and 597d are formed close to the seventh to ninth data lines 571a to 571c.

The first and third shield patterns 525a and 525c close to the seventh and eighth data lines 571a and 571b of the display substrate according to the present embodiment and the first and fifth shield patterns 425a and 425e of FIG. 21 may have substantially same shapes. However, the first and third shield patterns 525a and 525c formed in the first direction DI1 in the fifth and sixth pixel areas PX5(n,n) and PX6(n,n+1) extend downward near the eighth and ninth data lines 571b and 571c, not upward. Thus, the first and third shield patterns 525a and 525c connected to the first and third pixel electrodes 597a and 597c are formed on lower portions of the fifth and sixth pixel areas PX5(n,n) and PX6(n,n+1). In this case, first and third contact electrodes 527a and 527c respectively included in the first and third shield patterns 525a and 525c are electrically connected to the first and third pixel electrodes 597a and 597c through first and fourth contact holes CH1 and CH4. The first and fourth contact holes CH1 and CH4 are substantially the same as the first and sixth contact holes CH1 and CH6.

The second and fourth shield patterns 525b and 525d of the display substrate according to the present embodiment are respectively electrically connected to the second and fourth pixel electrodes 571b and 571d, and formed close to the seventh to ninth data lines 571a to 571c in upper portions of the fifth and sixth pixel areas PX5(n,n) and PX6(n,n+1). Second and fourth shield contact electrodes 527b and 527d included in the second and fourth shield patterns 525b and 525d are respectively electrically connected to the second and fourth pixel electrodes 597b and 597d through third and sixth contact holes CH3 and CH6.

A method of manufacturing the display substrate according to the present embodiment is substantially the same as the method according to Example Embodiment 5 except that the fifth pixel area PX5(n,n) and the sixth pixel area PX6(n,n+1) have asymmetric double-chevron shapes and that the first through fourth shield patterns have different shapes. Thus, the same reference numerals will be used to designate the same elements, and any redundant explanation will be omitted.

According to the present embodiment, the pixel areas P including the fifth pixel area PX5(n,n) and the sixth pixel area PX6(n,n+1) have asymmetric double-chevron shapes and are arranges in a substantially matrix configuration within that shape. Thus, light transmittance may be improved. Coupling capacitors generated by a data line and pixel electrodes may be not changed and pixel electrodes extending in the first direction near the centers of the fifth and sixth pixel areas PX5(n,n) and PX6(n,n+1) may be omitted by bent data lines. Thus, aperture ratio and light transmittance may be improved.

In the present embodiment, the first and third shield patterns 525a and 525c extending in the first direction DI1 in the vertical area VA are shown; however, the first and third shield patterns 525a and 525c may be formed close to the first and second power lines 131a and 131b. Thus, aperture ratio and light transmittance may be improved. In addition, the angle of the bend in the data line may be changeable according to the angle of the asymmetric double-chevron shape and widths of first and second electrodes.

According to the present invention, second and fourth power lines respectively connected to first and third power lines disposed in the first direction DI1 are alternately disposed at every data line, so that a first voltage and a second voltage are uniformly applied to a display area without delay. This way, the situation of charge rate being slower at one side of the display area than another side may be avoided, so that display quality may be improved.

In addition, source electrodes of switching elements connected to the first and third power lines are connected to the second and fourth power lines, so that contact holes are reduced. Thus, aperture ratio may be improved.

In addition, the second and fourth power lines are not disposed in lines in correspondence with pixels adjacent to each other in the second direction DI2. However, the second and fourth power lines are alternately disposed at left sides of the data lines or at right sides of the data lines with respect to the data lines corresponding to pixels adjacent in the extension direction of the data lines. Thus, a dot inversion may be implemented per a frame.

In addition, shield patterns connected to a first pixel electrode and a second pixel electrode are formed adjacent to a data line to overlap the first pixel electrode and the second pixel electrode. Therefore, generation of an electric field between the first pixel electrode and the data line and between the second pixel electrode and the data line may be prevented, reducing light leakage.

In addition, pixel electrodes extending in the first direction at a center portion of a pixel area having the asymmetric double-chevron shape may be omitted. Thus, aperture ratio and light transmittance may be improved.

The foregoing is illustrative of the present invention and is not to be construed as limiting thereof. Although example embodiments of the present invention have been described, those skilled in the art will readily appreciate that many modifications are possible without materially departing from the novel teachings and advantages of the present invention. Accordingly, all such modifications are intended to be included within the scope of the present invention as defined in the claims.

What is claimed is:

1. A display substrate comprising:
   a first pixel electrode comprising a plurality of first electrode bars;
   a data line providing a data voltage to the first pixel electrode;
   a second pixel electrode comprising a plurality of second electrode bars alternately disposed with the first electrode bars;
   a gate line substantially crossing the data line;
   a first power line extending in a same direction as the gate line to provide a first voltage to the second pixel electrode;
   a second power line crossing the first power line and electrically connected to the first power line;
   a first switching element electrically connected to the data line, the gate line and the first pixel electrode; and
   a second switching element electrically connected to the first power line, the gate line and the second pixel electrode.

2. The display substrate of claim 1, wherein the second power line is disposed at multiple data lines.

3. The display substrate of claim 1, further comprising:
   a third pixel electrode disposed adjacent to the first pixel electrode, the third pixel electrode comprising a plurality of third electrode bars;
   a fourth pixel electrode comprising a plurality of fourth electrode bars alternately disposed with the third electrode bars;
   a third power line formed adjacent to the first power line to provide a second voltage to the fourth pixel electrode; and
   a fourth power line extending in a direction crossing the third power line and electrically connected to the third power line.

4. The display substrate of claim 3, wherein the fourth power line is disposed at multiple data lines.

5. The display substrate of claim 4, wherein a plurality of data lines is disposed between the second power line and the fourth power line.

6. The display substrate of claim 4, wherein each of the second and fourth power lines is alternately disposed with respect to the data line corresponding to pixels adjacent in an extension direction of the data line.

7. The display substrate of claim 3, further comprising:
   a third switching element connected to the gate line and the third pixel electrode; and
   a fourth switching element connected to the gate line and the fourth pixel electrode.

8. The display substrate of claim 3, wherein the second switching element comprises:

a first gate electrode electrically connected to the gate line;
a first source electrode electrically connected to the first power line and connected to the second power line; and
a first drain electrode electrically connected to the second pixel electrode.

9. A method of manufacturing a display substrate, the method comprising:
forming a gate line extending in a first direction and a first power line adjacent to the gate line on a base substrate;
forming a data line and a second power line extending in a second direction crossing the first direction on the base substrate on which the gate line and the first power line are formed;
forming a first pixel electrode and a second electrode on the base substrate on which the data line and the second power line are formed, the first pixel electrode comprising a plurality of first electrode bars to be electrically connected to the data line through a first switching element, and the second electrode comprising a plurality of second electrode bars alternately disposed with the first electrode bars to be electrically connected to the first power line through a second switching element; and
electrically connecting the first power line and the second power line.

10. The method of claim 9, wherein forming the first power line comprises forming a third power line parallel to the first power line.

11. The method of claim 9, wherein forming the second power line comprises forming a fourth power line that is extending in the second direction.

12. The method of claim 11, wherein a plurality of data lines is disposed between the second power line and the fourth power line.

13. The method of claim 9, wherein the first power line and the second power line are electrically connected through a first transparent electrode.

14. The method of claim 9, wherein the first power line and the second power line are electrically connected through a source electrode of the first switching element.

15. A display device comprising:
a display substrate comprising:
a first pixel electrode comprising a plurality of first electrode bars,
a data line providing a data voltage to the first pixel electrode,
a second pixel electrode comprising a plurality of second electrode bars alternately disposed with the first electrode bars,
a gate line substantially crossing the data line,
a first power line formed adjacent to the gate line to provide a first voltage to the second pixel electrode,
a second power line crossing the first power line to be electrically connected to the first power line,
a first switching element electrically connected to the data line, the gate line and the first pixel electrode, and
a second switching element electrically connected to the first power line, the gate line and the second pixel electrode;
an opposite substrate facing the display substrate; and
a liquid crystal layer disposed between the display substrate and the opposite substrate.

16. The display device of claim 15, wherein the display substrate further comprises:
a third pixel electrode disposed adjacent to the first pixel electrode, the third pixel electrode comprising a plurality of third electrode bars;
a fourth pixel electrode comprising a plurality of fourth electrode bars alternately disposed with the third electrode bars;
a third power line formed adjacent to the first power line to provide a second voltage to the fourth pixel electrode; and
a fourth power line extending in a direction crossing the third power line and electrically connected to the third power line.

17. The display device of claim 16, wherein each of the second and fourth power lines is alternately disposed with respect to the data line corresponding to pixels adjacent in an extension direction of the data line.

18. The display device of claim 16, wherein the second power line and the fourth power line are alternately disposed at multiple data lines.

19. The display device of claim 15, wherein the liquid crystal layer is vertically aligned when a driving voltage is not applied thereto, and is horizontally aligned by the first and second pixel electrodes which receive the different voltages.

20. The display device of claim 15, wherein the display substrate comprises a display area and a peripheral area surrounding the display area, and a power wire connected to the second and fourth power lines is formed on the peripheral area which is disposed on an upper portion of the display substrate, a right portion of the display substrate and a left portion of the display substrate, when viewed on the display substrate.

21. A display substrate comprising:
a first pixel electrode electrically connected to a gate line and a first data line;
a second pixel electrode alternately disposed with the first pixel electrode to be electrically connected to the gate line and a first power line;
a first shield pattern disposed closely to at least one of the first data line and a second data line facing the first data line, the first shield pattern overlapping a first end portion of the first pixel electrode to be electrically connected to the first pixel electrode; and
a second shield pattern disposed closely to at least one of the first data line and the second data line, the second shield pattern overlapping a first end portion of the second pixel electrode to be electrically connected to the second pixel electrode.

22. The display substrate of claim 21, wherein the gate line, the first shield pattern and the second shield pattern are formed from a same conductive layer.

23. The display substrate of claim 22, further comprising:
a first switching element electrically connected to the first data line and the gate line; and
a second switching element electrically connected to the gate and the first power line.

24. The display substrate of claim 23, wherein the first switching element comprises a first gate electrode connected to the gate line, a first source electrode connected to the first data line and a first drain electrode connected to the first pixel electrode, and the first drain electrode and the first shield pattern making contact with the first pixel electrode through a first contact hole.

25. The display substrate of claim 23, wherein the second switching element comprises a second gate electrode connected to the gate line, a second source electrode connected to the first power line adjacent to the gate line and a second drain electrode connected to the second pixel electrode, and the second drain electrode and the second shield pattern making contact with the second pixel electrode through a second contact hole.

26. The display substrate of claim 21, further comprising:
a third shield pattern disposed closely to the second data line, the third shield pattern covering a second end portion of the first pixel electrode; and
a fourth shield pattern disposed closely to the first data line, the fourth shield pattern covering a second end portion of the second pixel electrode.

27. The display substrate of claim 26, wherein the third shield pattern is electrically connected to the first pixel electrode through a third contact hole formed through an end portion of the third shield pattern, and
the fourth shield pattern is electrically connected to the second pixel electrode through a fourth contact hole formed through an end portion of the fourth shield pattern.

28. The display substrate of claim 26, wherein the third shield pattern is formed closely to the second data line to cover the second end portion of the first pixel electrode, and the fourth shield pattern is formed closely to the first data line to cover the second end portion of the second pixel electrode.

29. The display substrate of claim 26, further comprising a connection pattern connecting the first shield pattern and the third shield pattern.

30. The display substrate of claim 21, further comprising a second power line adjacent to the first power line and receiving a voltage different from a voltage of the first power line.

31. The display substrate of claim 21, wherein the first data line and the second data line extend in varying diagonal directions, and a pixel area between the first data line and the second data line comprises a vertical area formed at a center portion of the pixel area.

32. The display substrate of claim 31, wherein the first shield pattern is formed on one side of the vertical area, and the second shield pattern is formed on the other side of the vertical area.

33. The display substrate of claim 32, wherein an edge portion of the first shield pattern corresponding to a far area from the first data line fully overlapping an edge portion of the first pixel electrode corresponding to a far area from the first data line, and
an edge portion of the second shield pattern corresponding to a far area from the second data line fully overlapping an edge portion of the second pixel electrode corresponding to a far area from the second data line.

34. The display substrate of claim 21, further comprising:
a connection pattern connecting the first shield pattern and the third shield pattern, the connection pattern overlapping the first and second pixel electrodes.

35. A method of manufacturing a display substrate, the method comprising:
forming a gate line extending in a first direction and a first shield pattern and a second shield pattern extending in a second direction on a base substrate;
forming a first data line extending in the second direction and disposed closely to at least one of the first shield pattern and the second shield pattern, and a second data line facing the first data line to be disposed closely to at least one of the first shield pattern and the second shield pattern; and
forming a first pixel electrode which has a first end portion that partially overlaps the first shield pattern, the first pixel electrode contacting the first shield pattern through a first contact hole, and a second pixel electrode which has a first end portion that partially overlaps the second shield pattern, the second pixel electrode contacting the second shield pattern through a second contact hole.

36. The method of claim 35, wherein a first power line adjacent to the gate line is further formed when the gate line is formed.

37. The method of claim 36, further comprising:
forming a first switching element comprising a first source electrode connected to the first data line, a first gate electrode connected to the gate line, and a first drain electrode contacting the first shield pattern and the first pixel electrode through the first contact hole; and
forming a second switching element comprising a second source electrode connected to the first power line, a second gate electrode connected to the gate line, and a second drain electrode contacting the second shield pattern and the second pixel electrode through the second contact hole.

38. The method of claim 36, wherein a second power line adjacent to the first power line is further formed when the gate line is formed.

39. The method of claim 35, further comprising:
forming a third shield pattern disposed closely to the second data line to cover a second end portion of the first pixel electrode; and
forming a fourth shield pattern disposed closely to the first data line to cover a second end portion of the second pixel electrode.

40. The method of claim 39, wherein the first pixel electrode contacts the third shield pattern through a third contact hole, and the second pixel electrode contacts the fourth shield pattern through a fourth contact hole.

41. The method of claim 39, wherein a connection pattern connecting the first shield pattern and the third shield pattern is further formed when the gate line is formed.

42. The method of claim 35, wherein the first data line and the second data line extend in varying diagonal directions in areas close to neighboring gate lines and extend in a vertical direction at center portions between the areas close to the neighboring gate lines.

43. A display device comprising:
a display substrate comprising:
a first pixel electrode electrically connected to a gate line and a first data line;
a second pixel electrode alternately disposed with the first pixel electrode and electrically connected to the gate line and a first power line;
a first shield pattern disposed closely to at least one of the first data line and a second data line facing the first data line, the first shield pattern overlapping a first end portion of the first pixel electrode, and the first shield pattern being electrically connected to the first pixel electrode; and
a second shield pattern disposed closely to at least one of the first data line and the second data line, the second shield pattern overlapping a first end portion of the second pixel electrode, and the second shield pattern being electrically connected to the second pixel electrode;
an opposite substrate facing the display substrate; and
a liquid crystal layer disposed between the display substrate and the opposite substrate.

44. The display device of claim 43, wherein the liquid crystal layer is vertically aligned when a driving voltage is not applied thereto, and is horizontally aligned by the first pixel electrode and the second pixel electrode when the driving voltage is applied thereto.

45. The display device of claim 44, wherein the display substrate further comprises:
a third shield pattern disposed closely to the second data line to cover a second end portion of the first pixel electrode; and
a fourth shield pattern disposed closely to the first data line to cover a second end portion of the second pixel electrode.

46. The display device of claim 43, wherein the first data line and the second data line extend in varying diagonal directions, and a pixel area between the first data line and the second data line comprises a vertical area formed at a center portion of the pixel area when viewed from a plan view.

* * * * *